US012572461B2

(12) United States Patent
Deng et al.

(10) Patent No.: US 12,572,461 B2
(45) Date of Patent: Mar. 10, 2026

(54) POWER CONTROL IN MEMORY DEVICES, OPERATION METHODS THEREOF, AND RELATED STRUCTURES

(71) Applicant: YANGTZE MEMORY TECHNOLOGIES CO., LTD., Wuhan (CN)

(72) Inventors: Lang Deng, Wuhan (CN); Shu Xie, Wuhan (CN); Wenjie Mu, Wuhan (CN); Wei Huang, Wuhan (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 1 day.

(21) Appl. No.: 18/677,468

(22) Filed: May 29, 2024

(65) Prior Publication Data

US 2025/0231868 A1 Jul. 17, 2025

(30) Foreign Application Priority Data

Jan. 15, 2024 (CN) .......................... 202410058295.1

(51) Int. Cl.
| | |
|---|---|
| *G06F 12/00* | (2006.01) |
| *G06F 12/02* | (2006.01) |
| *G11C 16/04* | (2006.01) |
| *G11C 16/32* | (2006.01) |
| *G11C 16/30* | (2006.01) |

(52) U.S. Cl.
CPC ...... *G06F 12/0246* (2013.01); *G11C 16/0483* (2013.01); *G11C 16/32* (2013.01); *G11C 16/30* (2013.01)

(58) Field of Classification Search
CPC . G06F 12/0246; G11C 16/0483; G11C 16/32; G11C 16/30
USPC .......................................................... 711/103
See application file for complete search history.

(56) References Cited

U.S. PATENT DOCUMENTS

| | | | | |
|---|---|---|---|---|
| 2020/0167273 A1* | 5/2020 | Byun | .................. | G11C 11/4085 |
| 2024/0295989 A1* | 9/2024 | Kavala | ................ | G06F 13/4068 |

FOREIGN PATENT DOCUMENTS

| | | | | | |
|---|---|---|---|---|---|
| AU | 2013204047 B2 | * | 11/2015 | | |
| KR | 20250098158 A | * | 7/2025 | .............. | G11C 7/10 |
| WO | WO-2012122381 A2 | * | 9/2012 | ......... | G11C 11/4076 |

* cited by examiner

*Primary Examiner* — Mardochee Chery
(74) *Attorney, Agent, or Firm* — Conley Rose, P.C.

(57) ABSTRACT

Examples of the present application disclose a memory device and an operation method thereof, and related structures. An interface of the memory device includes a first circuit and is configured to: receive a first operation command and a second operation command, wherein the first operation command is to indicate to perform a first operation on the memory device, the second operation command is to indicate to turn off the first circuit in the memory device, and the first circuit includes a circuit that may not be used when the first operation is performed on the memory device; and receive a third operation command, wherein the third operation command is to indicate to turn on the first circuit.

20 Claims, 18 Drawing Sheets

MEMORY DEVICE

<u>100</u>

INTERFACE

<u>101</u>

FIRST CIRCUIT

1010

POWER CONTROL IN MEMORY DEVICES, OPERATION METHODS THEREOF, AND RELATED STRUCTURES

CROSS-REFERENCE TO RELATED APPLICATIONS

The present application claims the benefit of priority to China Patent Application No. 202410058295.1, filed on Jan. 15, 2024, is titled "MEMORY DEVICE AND ITS OPERATING METHOD AND RELATED STRUCTURES," the content of which is incorporated herein by reference in its entirety.

TECHNICAL FIELD

The present application relates to the technical field of memory technology, and in example to memory devices and operation methods thereof, and related structures.

BACKGROUND

With the development of memory technology, three-dimensional (3D) memory devices are widely used, for example, in computers, tablets, etc. Among them, 3D NAND flash is one of the most popular memory devices. For the 3D NAND flash, energy consumption is one of the research directions that are focused on improving its memory performance.

SUMMARY

In view of this, examples of the present application provide memory devices and operation methods thereof, and related structures.

In a first aspect, examples of the present application provide an interface of a memory device. The interface includes a first circuit and is configured to receive a first operation command, a second operation command, and a third operation command. The first operation command is to indicate to perform a first operation on the memory device. The second operation command is to indicate to turn off the first circuit in the memory device. The first circuit includes a circuit that may not be used when the first operation is performed on the memory device. The third operation command is to indicate to turn on the first circuit.

In some examples, the first operation command includes one of a read command, a write command or an erase command. In some examples, the first operation includes one of a read operation, a write operation, or an erase operation.

In some examples, the second operation command includes first address information indicating a first die on which the first operation is performed in the memory device.

In some examples, the first operation command includes second address information including the first address information and indicating a page on which the first operation is performed in the first die.

In some examples, the first operation command includes second address information including the first address information and indicating a page on which the first operation is performed in the first die.

In some examples, the interface is further configured to work in a first mode. In the first mode, the interface employs an ONFI or Toggle standard protocol to receive the first operation command and the second operation command. In the ONFI or Toggle standard protocol, an address latch enable signal is employed to determine that the interface receives the second address information included in the first operation command and the first address information included in the second operation command. A command latch enable signal is employed to determine that the interface receives second command identifier information included in the first operation command and first command identifier information included in the second operation command.

In some examples, in the first mode, the first circuit that is turned off includes at least one of a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the interface is further configured to work in a second mode. In the second mode, the interface employs a separate command address SCA protocol to receive the first operation command and the second operation command. In the SCA protocol, a first identifier is employed to determine that the interface receives the second address information included in the first operation command and the first address information included in the second operation command. A second identifier is employed to determine that the interface receives second command identifier information included in the first operation command and first command identifier information included in the second operation command. The first identifier is different from the second identifier.

In some examples, in the second mode, the first circuit that is turned off includes at least one of a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the second operation command further includes third address information indicating a second die on which the first operation is not performed in the memory device.

In some examples, the interface is further configured to work in a first mode. In the first mode, the interface employs an ONFI or Toggle standard protocol to receive the first operation command and the second operation command. The first circuit that is turned off includes at least one of power supply circuits of high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

In some examples, the interface is further configured to work in a second mode. In the second mode, the interface employs a separate command address SCA protocol to receive the first operation command and the second operation command. The first circuit that is turned off includes at least one of high-speed I/O circuits corresponding to the first die and the second die in the memory device; power supply circuits of the high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

In a second aspect, examples of the present application further provide a memory device. The memory device include an interface; a memory array; and a control circuit. The interface is configured to receive a first operation command and a second operation command. The control circuit is connected with the interface and the memory array respectively and is configured to perform a first operation on the memory array in response to the first operation command; and turn off a first circuit in the interface in response to the second operation command. The first circuit includes a circuit that may not be used when the first operation is performed on the memory device. The interface is further configured to receive a third operation command. The control circuit is further configured to turn on the first circuit in response to the third operation command.

In some examples, the first operation command includes one of a read command; a write command; or an erase command. The first operation includes one of the following: a read operation; a write operation; or an erase operation.

In some examples, the memory array includes a plurality of dies each including a plurality of pages. The second operation command includes first address information indicating a first die on which the first operation is performed in the memory array. The first operation command includes second address information including the first address information and indicating a page on which the first operation is performed in the first die.

In some examples, the interface is further configured to work in a first mode. In the first mode, the interface employs an ONFI or Toggle standard protocol to receive the first operation command and the second operation command. In the ONFI or Toggle standard protocol, an address latch enable signal is employed to determine that the interface receives the second address information included in the first operation command and the first address information included in the second operation command. A command latch enable signal is employed to determine that the interface receives second command identifier information included in the first operation command and first command identifier information included in the second operation command.

In some examples, in the first mode, the first circuit that is turned off includes at least one of a power supply circuit of a high-speed I/O circuit corresponding to the first die in the interface; a bias circuit of the high-speed I/O circuit corresponding to the first die in the interface; or a high-speed clock duty cycle correction circuit of the high-speed I/O circuit corresponding to the first die in the interface.

In some examples, the interface is further configured to work in a second mode. In the second mode, the interface employs a separate command address SCA protocol to receive the first operation command and the second operation command. In the SCA protocol, a first identifier is employed to determine that the interface receives the second address information included in the first operation command and the first address information included in the second operation command. A second identifier is employed to determine that the interface receives second command identifier information included in the first operation command and first command identifier information included in the second operation command, wherein the first identifier is different from the second identifier.

In some examples, in the second mode, the first circuit that is turned off includes at least one of a high-speed I/O circuit corresponding to the first die in the interface; a power supply circuit of the high-speed I/O circuit corresponding to the first die in the interface; a bias circuit of the high-speed I/O circuit corresponding to the first die in the interface; or a high-speed clock duty cycle correction circuit of the high-speed I/O circuit corresponding to the first die in the interface.

In some examples, the second operation command further includes third address information indicating a second die on which the first operation is not performed in the memory array.

In some examples, the interface is further configured to work in a first mode. In the first mode, the interface employs an ONFI or Toggle standard protocol to receive the first operation command and the second operation command. The first circuit that is turned off includes at least one of power supply circuits of high-speed I/O circuits corresponding to the first die and the second die in the interface; bias circuits of the high-speed I/O circuits corresponding to the first die and the second die in the interface; or high-speed clock duty cycle correction circuits of the high-speed I/O circuits corresponding to the first die and the second die in the interface.

In some examples, the interface is further configured to work in a second mode. In the second mode, the interface employs a separate command address SCA protocol to receive the first operation command and the second operation command. The first circuit that is turned off includes at least one of high-speed I/O circuits corresponding to the first die and the second die in the interface; power supply circuits of the high-speed I/O circuits corresponding to the first die and the second die in the interface; bias circuits of the high-speed I/O circuits corresponding to the first die and the second die in the interface; or high-speed clock duty cycle correction circuits of the high-speed I/O circuits corresponding to the first die and the second die in the interface.

In a third aspect, examples of the present application further provide a method of operating a memory device. The method of operating the memory device includes receiving a first operation command and a second operation command; performing a first operation on the memory device in response to the first operation command; and turning off a first circuit in the memory device in response to the second operation command. The method of operating the memory device further includes receiving a third operation command; and turning on the first circuit in response to the third operation command. The first circuit includes a circuit that may not be used when the first operation is performed on the memory device.

In some examples, the first operation command includes one of a read command; a write command; or an erase command. The first operation includes one of a read operation; a write operation; or an erase operation.

In some examples, the second operation command includes first address information indicating a first die on which the first operation is performed in the memory array. The first operation command includes second address information including the first address information and indicating a page on which the first operation is performed in the first die.

In some examples, the method of operating the memory device includes employing an ONFI or Toggle standard protocol to receive the first operation command and the second operation command. In other examples, the method of operating the memory device includes employing a separate command address SCA protocol to receive the first operation command and the second operation command.

In some examples, in the case of employing an ONFI or Toggle standard protocol to receive the first operation command and the second operation command, the first circuit that is turned off includes at least one of a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, in the case of employing a separate command address SCA protocol to receive the first operation command and the second operation command, the first circuit that is turned off includes at least one of a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the second operation command further includes third address information indicating a second die on which the first operation is not performed in the memory device.

In some examples, in the case of employing an ONFI or Toggle standard protocol to receive the first operation command and the second operation command, the first circuit that is turned off includes at least one of power supply circuits of high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

In some examples, in the case of employing a separate command address SCA protocol to receive the first operation command and the second operation command, the first circuit that is turned off includes at least one of high-speed I/O circuits corresponding to the first die and the second die in the memory device; power supply circuits of the high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

In a fourth aspect, examples of the present application further provide a memory system. The memory system includes a memory controller and a memory device coupled with the memory controller. The memory controller is configured to send a first operation command and a second operation command. The memory device is configured to receive the first operation command and the second operation command. The first operation command is to indicate to perform a first operation on the memory device and the second operation command is to indicate to turn off a first circuit in the memory device. The first circuit includes a circuit that may not be used when the first operation is performed on the memory device. The memory controller is further configured to send a third operation command when a preset condition is met, and the memory device is further configured to receive the third operation command. The third operation command is to indicate to turn on the first circuit.

In some examples, the memory device includes an interface configured to work in a first mode or a second mode. In the first mode, the interface employs an ONFI or Toggle standard protocol to receive the first operation command, the second operation command, and the third operation command. In the second mode, the interface employs a separate command address SCA protocol to receive the first operation command, the second operation command, and the third operation command.

In some examples, the second operation command includes first address information indicating a first die on which the first operation is performed in the memory device. In the first mode, the first circuit that is turned off includes at least one of a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device. In some examples, in the second mode, the first circuit that is turned off includes at least one of a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the second operation command further includes third address information indicating a second die on which the first operation is not performed in the memory device. In the first mode, the first circuit that is turned off includes at least one of a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device. In some examples, in the second mode, the first circuit that is turned off includes at least one of a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the meeting the preset condition includes one of the following: in the case that the first operation command includes a read command and the first operation includes a read operation, before the memory device feeds back read data in response to the read command; in the case that the first operation command includes a write command and the first operation includes a write operation, the memory device completes the write operation in response to the write command; or in the case that the first operation command includes an erase command and the first operation includes an erase operation, the meeting the preset condition includes the memory device completes the erase operation in response to the erase command.

BRIEF DESCRIPTION OF THE DRAWINGS

In the drawings (which are not drawn to scale), like reference numerals may describe like parts in the different views. Like reference numbers with different letter suffixes may indicate different examples of like parts. The drawings generally illustrate the various examples discussed herein, by way of example and not limitation.

DETAILED DESCRIPTION

Figure 1:
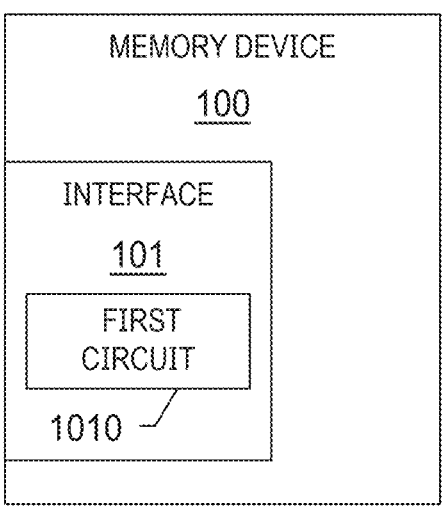
FIG. 1 is a schematic structural diagram of an interface of a memory device provided by examples of the present application.

Examples disclosed in the present application will be described in more detail below with reference to the accompanying drawings. Although examples of the present application are shown in the drawings, it should be understood that the present application may be implemented in various ways and should not be limited to the DETAILED DESCRIPTION set forth herein. Rather, these examples are provided so that the present application can be more thoroughly understood and the scope disclosed in the present application can be fully conveyed to those skilled in the art.

In the following description, numerous specific details are given in order to provide a more thorough understanding of the present application. It will be apparent, however, to one skilled in the art that the present application may be practiced without one or more of these details. In other examples, some technical features well-known in the art are not described to avoid confusion with the present application; that is, not all features of the actual example are described here, and well-known functions and structures are not described in detail.

In the drawings, the size of layers, regions, elements and their relative sizes may be exaggerated for clarity. Like reference numerals refer to like elements throughout.

It will be understood that when an element or layer is referred to as being "on," "adjacent to," "connected to", "coupled with" or "coupled to" other elements or layers, it can be directly on, adjacent to, connected to, or coupled to other elements or layers, or intervening elements or layers may be present. In contrast, when an element is referred to as being "directly on," "directly adjacent to," "directly connected to" or "directly coupled to" other elements or layers, there are no intervening elements or layers. It will be understood that, although the terms such as first, second, third etc., may be used to describe at least one of various elements, components, regions, layers or sections, at least one of these elements, components, regions, layers or sections should not be limited by these terms. These terms are only used to distinguish one element, component, region, layer or section from another element, component, region, layer or section. Thus, a first element, component, region, layer or section discussed below could be represented as a second element, component, region, layer or section without departing from the teachings of the present application. When a second element, component, region, layer or section is discussed, it does not indicate that a first element, component, region, layer or section exists in the present application.

Spatial relationship terms such as "under", "below", "beneath", "underneath", "on", "above" and so on, can be used here for convenience to describe the relationship between one element or feature and other elements or features shown in the figures. It will be understood that the spatially relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can include both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present application. As used herein, "a", "an" and "said/the" in singular forms are intended to include the plural forms as well, unless the context clearly dictates otherwise. It should also be understood that at least one of the terms "consists of" or "including", when used in this specification, identify the presence of at least one of stated features, integers, operations, elements or components, but do not exclude presence or addition of at least one of one or more other features, integers, operations, elements, components or groups. As used herein, the term "at least one of . . . " includes any and all combinations of the associated listed items.

For ease of understanding the characteristics and technical content of the examples of the present application in more detail, the examples of the present application will be described in detail below in conjunction with the accompanying drawings. The attached drawings are only for reference and description, and are not intended to limit the examples of the present application.

FIG. 1 shows a schematic structural diagram of an interface 101 of a memory device 100 provided by examples of the present application. As shown in FIG. 1, the interface 101 includes a first circuit 1010. The interface 101 is configured to receive a first operation command, a second operation command, and a third operation command. The first operation command is to indicate to perform a first operation on the memory device, and the second operation command is to indicate to turn off the first circuit in the memory device. The first circuit 1010 includes a circuit that may not be used when the first operation is performed on the memory device 100. The third operation command is to indicate to turn on the first circuit 1010.

In some examples, the first operation command includes one of the following: a read command; a write command; or an erase command. In some examples, the first operation includes one of the following: a read operation; a write operation; or an erase operation.

In some examples, the memory device 100 may refer to an apparatus that is configured to store at least one of programs or data, and includes an interface 101 that includes a first circuit. The interface 101 may receive an operation command sent by the memory controller coupled with the memory device, for example, the first operation command and the second operation command. Actually, the memory device may further comprise a control circuit and a memory array. The control circuit may perform a first operation on the memory array in the memory device in response to the first operation command received by the interface; and the control circuit may further turn off the first circuit in response to the second operation command received by the interface 101. Herein, the first operation may be any operation indicated by the first operation command, such as a read command, a write command, an erase command, etc. The first circuit may refer to a circuit that may not be used when the first operation is performed on the memory device. In an example, the first circuit is a circuit that may not be used in the interface when the first operation is performed on the memory device. In other words, circuits in the interface that do not affect the execution of the first operation are turned off. Then, the interface 101 may also receive the third operation command, and transmit the third operation command to the control circuit. The control circuit may turn on these first circuits again in response to the third operation command, for later use.

During a practical application process, functions described above of turning off the first circuit and turning on the first circuit again are referred to as power consumption saving functions. In an example, the control circuit enables the power consumption saving function in response to the second operation command, and turns off the first circuit when the power consumption saving function is enabled. Furthermore, the control circuit disables the power consumption saving function in response to the third operation command, and turns on the first circuit when the power consumption saving function is disabled.

Figure 2:
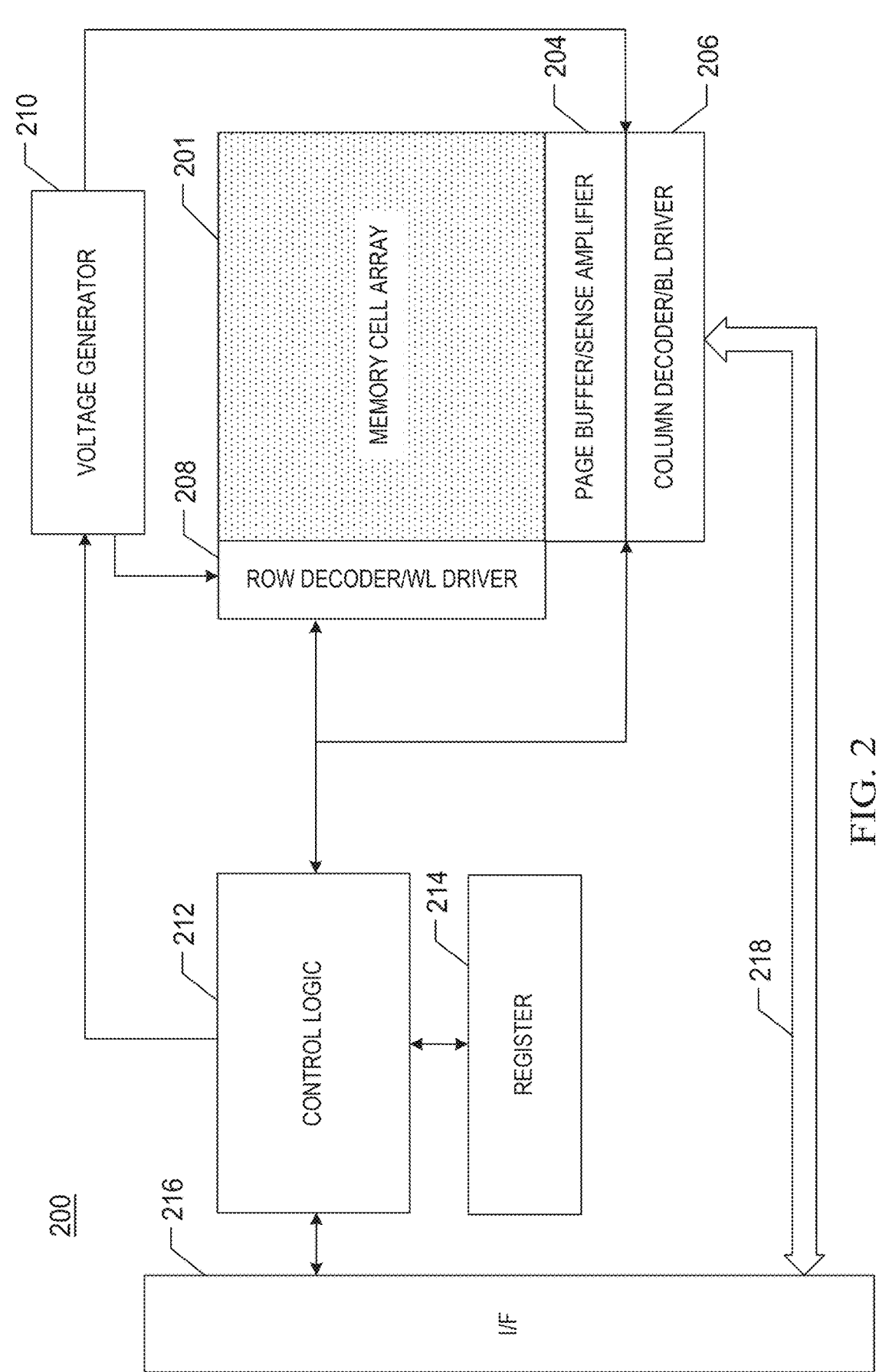
FIG. 2 is a schematic diagram of a connection relationship among a control circuit, an interface, and a memory array in a memory device provided by examples of the present application.

During a practical application process, a relationship among the control circuit, the interface, and the memory array is shown in FIG. 2, for example. FIG. 2 shows a schematic structural diagram of the memory device. A logical relationship among the control circuit, the interface, and the memory array is shown in FIG. 2. The memory device 200 may be an example of the memory device 100 described above. The memory device 200 comprises an I/F interface 216, a memory array 201, and a control circuit including circuits such as a page buffer/sense amplifier 204, a column decoder/bit line driver 206, a row decoder/word line driver 208, a voltage generator 210, a control logic 212, a register 214, a data bus 218, etc. The I/F interface 216 and the control circuit may be collectively referred to as peripheral circuits of the memory array. It is to be noted that, the peripheral circuit further includes some other circuits not shown in FIG. 2. The peripheral circuit is coupled with the memory array 201, and is configured to: receive some operation commands, and perform corresponding operations on the memory array in response to some operation commands, for example, perform the first operation in response to the first operation command. For another example, the peripheral circuit may further be configured to: receive the second operation command; turn off the first circuit in response to the second operation command; receive the third operation command; and turn on the first circuit in response to the third operation command, and so on. Which portion of the peripheral circuit is configured to perform the corresponding above-mentioned actions has already been particularly described, such that details are not described herein again. In some examples, the I/F interface 216 shown in FIG. 2 is an example of the interface 101.

The memory array 201 may include volatile memory medium that retains data stored therein even when not being supplied with power. The memory array 201 may further include volatile memory medium. In examples of the present application, the memory array may include any storage medium disclosed, for example, volatile memory medium such as dynamic random access memory (DRAM) and Static RAM (SRAM), or non-volatile memory medium such as read only memory (ROM), mask ROM (MROM), programmable ROM (PROM), erasable programmable ROM (EPROM), electrically erasable programmable ROM (EEPROM), ferroelectric RAM (FRAM), phase-change RAM (PRAM), magnetoresistive RAM (MRAM), a resistive RAM (RRAM or ReRAM), and flash memory (e.g., three-dimensional NAND flash).

Figure 3:
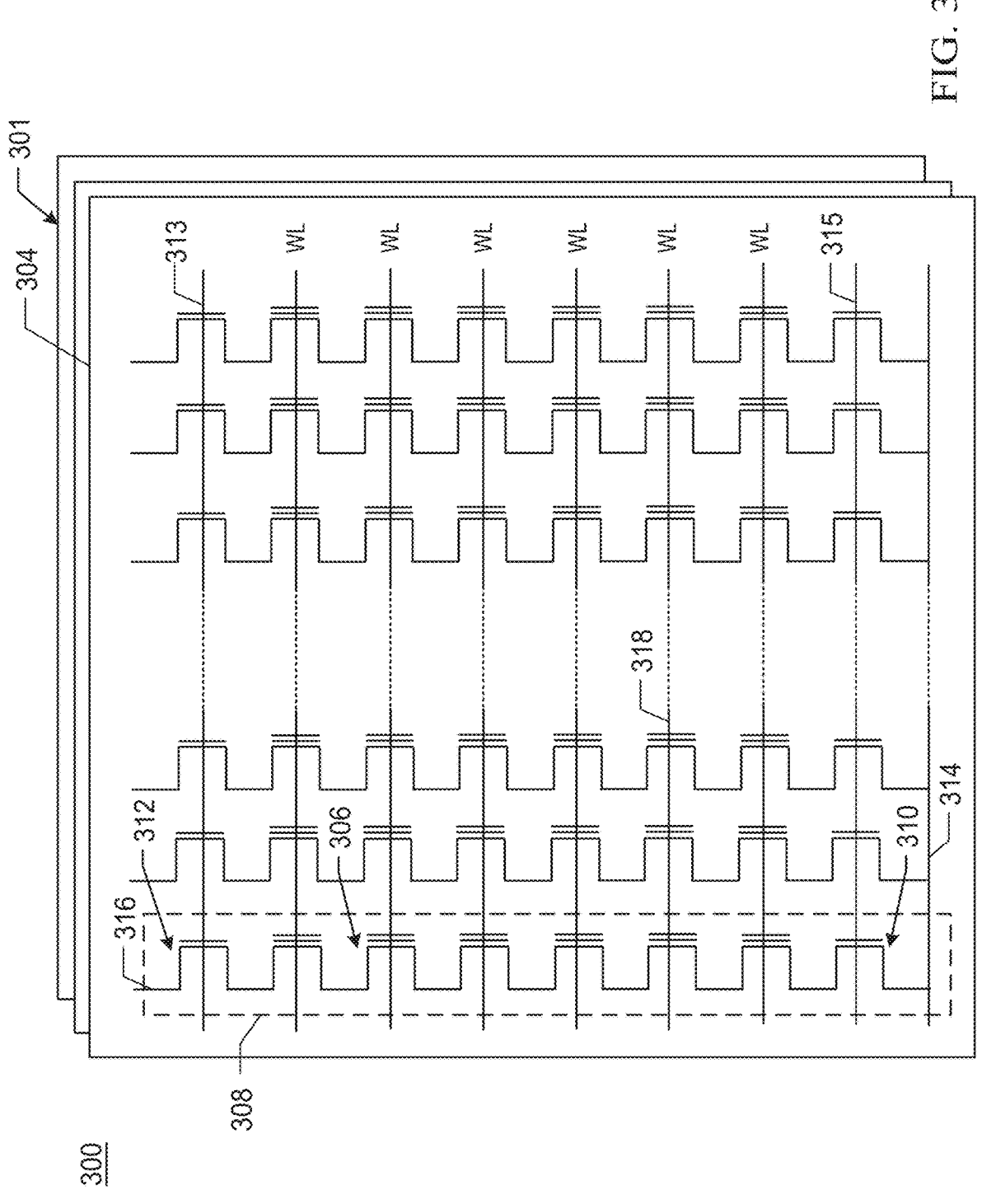
FIG. 3 is a schematic structural diagram of a memory array provided by examples of the present application.

For example, FIG. 3 shows a schematic diagram of an example memory array 300 provided by some aspects of the present application. The memory array 300 may be an example of the memory array 201. Taking a three-dimensional NAND type memory array as an example of the memory array 300 for illustration, in which memory cells 306 are provided in the form of an array of NAND memory strings 308 each extending vertically above a substrate (not shown). In some examples, each NAND memory string 308 includes a plurality of memory cells 306 coupled in series and stacked vertically. Each memory cell 306 can hold a continuous, analog value, such as an electrical voltage or charge, that depends on the number of electrons trapped within a region of the memory cells 306. Each memory cell 306 can be either a floating gate type of memory cell including a floating-gate transistor or a charge trap type of memory cell including a charge-trap transistor.

In some examples, each memory cell 306 is a single-level cell (SLC) that has two possible memory states (or referred to as data states) and thus, can store one bit of data. For example, the first memory state "0" can correspond to a first range of voltages, and the second memory state "1" can correspond to a second range of voltages. In some examples, each memory cell 306 is a double-level cell (DLC) that is capable of storing more than a single bit of data in four memory states. For example, the DLC can store two bits per cell, three bits per cell (also known as Trinary-Level cell (TLC)), four bits per cell (also known as a Quad-Level cell (QLC)), or five bits per cell (also known as a Penta-Level cell (PLC)). In one example, if each DLC stores two bits of data, the DLC may be programmed to program a memory cell to one of three possible program levels from an erase state by writing one of three possible nominal storage values to the memory cell, and herein, a fourth nominal storage value may be used to represent the erase state. That is, the plurality of memory states for the memory cell include one erase state or a plurality of program states, and a voltage value included in a range of voltages (i.e., distribution of threshold voltage Vt) of the memory cell corresponding to the erase state is less than a voltage value included in distribution of threshold voltage of the memory cells corresponding to other program states.

As shown in FIG. 3, each NAND memory string 308 can include a bottom selective gate (BSG 310) at its source end and a top selective gate (TSG 312) at its drain end. BSG 310 and TSG 312 can be configured to activate selected NAND memory strings 308 during read and program operations. In some examples, the sources of NAND memory strings 308 in the same block 304 are coupled through the same source line (SL) 314, e.g., a common SL. In other words, all NAND memory strings 308 in the same block 304 have an array common source (ACS), according to some examples. TSG 312 of each NAND memory string 308 is coupled to a respective bit line (BL) 316 from which data can be read or written via an output bus (not shown), according to some examples. In some examples, each NAND memory string 308 is configured to be selected or deselected by at least one of: applying a select voltage (e.g., above the threshold voltage of the transistor having TSG 312) or a deselect voltage (e.g., 0 V) to respective TSG 312 through one or more drain selective lines or top selective lines 313 or applying a select voltage (e.g., above the threshold voltage of the transistor having BSG 310) or a deselect voltage (e.g., 0 V) to respective BSG 310 through one or more source selective lines or bottom selective lines 315.

As shown in FIG. 3, the NAND memory strings 308 can be organized into multiple blocks 304, each of which can have a common source line 314, e.g., coupled to the ground. In some examples, each block 304 is the basic data unit for erase operations, i.e., all memory cells 306 on the same block 304 are erased at the same time. To erase memory cells 306 in a selected block 304, source lines 314 coupled to the selected block 304 as well as unselected blocks 304 in the same plane as the selected block 304 can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block. Memory cells 306 of adjacent NAND memory strings 308 can be coupled through word lines 318 that select which row of memory cells 306 is affected by read and program operations.

Figure 4:
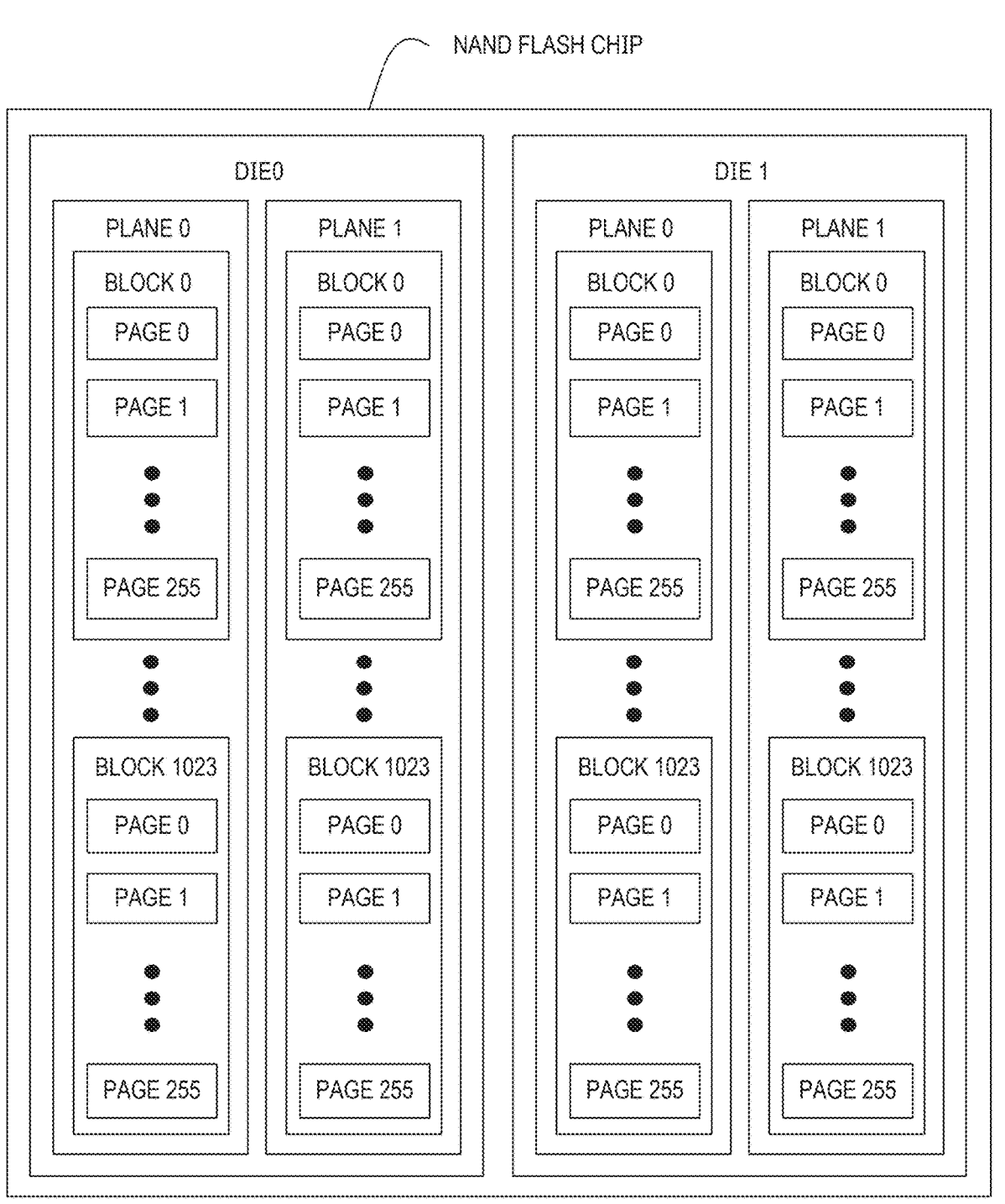
FIG. 4 is an organizational chart of a memory array in a NAND flash chip provided by examples of the present application.

A position relationship among the word lines, bit lines, and memory cells included in the memory array in the memory device is shown in detail in FIG. 3. From the perspective of products, the memory device such as a NAND flash may include several flash chips, and each flash chip includes several dies (or referred to as LUN). A structure of each die may be shown in FIG. 2, and includes a peripheral circuit and a memory array. The memory array includes several planes, each plane includes several blocks 304, and each block includes several pages. It is to be noted that, the I/F interface 216 in FIG. 2 may be an interface of one die, and may also be shared by the plurality of dies to receive some operation commands of a memory controller mentioned later, so as to operate these dies together. For example, FIG. 4 shows a schematic diagram of an internal architecture of a NAND flash chip provided by examples of the present application. In FIG. 4, the flash chip 400 includes DIE 0 and DIE 1. The DIE 0 and the DIE 1 both include two planes (for example, Plane 0 and Plane 1), each plane includes a plurality of blocks (for example, Block 0 to Block 1023), and each block includes a plurality of pages (Page 0 to Page 255).

It is to be noted that, structures in FIG. 4 are only examples. During an actual use process, the number of the dies, planes, blocks, and pages included in the memory array may be designed according to actual situations.

Figure 5:
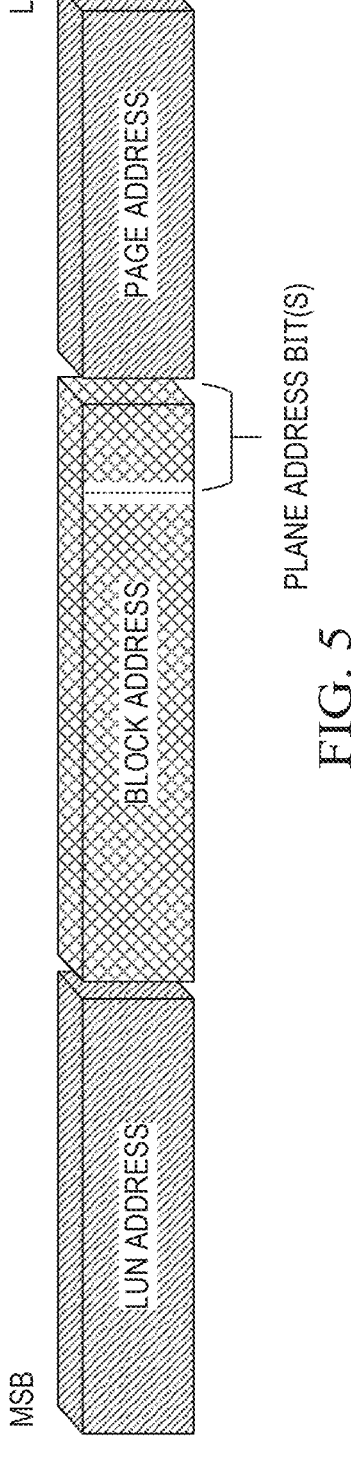
FIG. 5 is a schematic definition diagram of a row address provided by examples of the present application.

During an actual use process, based on the flash chip shown in FIG. 4, in order to access these memory resources, row addresses and column addresses are used. The column addresses include offset addresses in the page. The row addresses may be defined as shown in FIG. 5, and include a LUN address, a block address, and a page address in sequence from a most significant bit (MSB) to a less significant bit (LSB. The LUN address is for accessing the corresponding die described above. The block address is for accessing a block in a particular die, and the lowest bit is the page address The page address is for accessing a particular plane in a particular block. The page address is for accessing a particular page (also known as a page) in a particular block. According to a multi-plane operation in an Open NAND Flash Interface (ONFI) protocol, the page addresses of each plane must be the same; and for the block addresses, different manufacturers have different requirements to produce memory arrays, which are not described in detail here.

Figure 6:
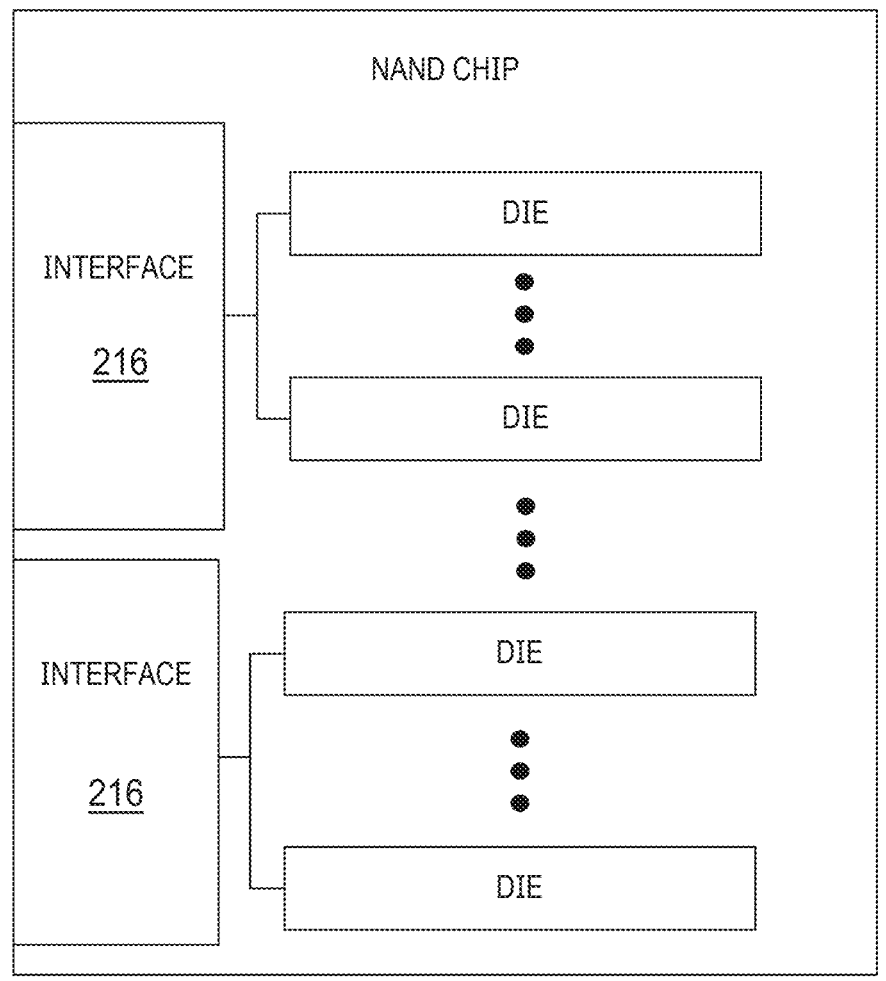
FIG. 6 is a block diagram of a relationship between an interface and a die in a NAND chip provided by examples of the present application.

During an actual use process, the die (or the LUN) in the memory array may be a basic unit for executing a flash command, may be disposed on a chip and connected with the memory controller coupled to the memory device through a peripheral pin, to receive a command or an address sent by the memory controller through the I/F interface 216 connected with the peripheral pin. An example shows a flash NAND chip, as shown in FIG. 6. The NAND chip may include storage medium for one or more dies (LUNs). In FIG. 6, the NAND chip further includes the I/F interface 216 described above. The I/F interface 216 may be configured to work in a first mode (communicate by employing an ONFI or Toggle standard protocol) or work in a second mode (communicate by employing a Separate Command Address (SCA) protocol) by the memory controller. From the perspective of the memory controller, the plurality of DIEs need to be in parallel for performance requirements, thus a plurality of channels are configured in general, and one channel includes one or more dies, which are adjusted according to requirements. Then LUNs on one channel share a set of I/F interfaces 216 to realize parallelism. That is, the memory controller sends the command or the address through the I/F interface 216; then, the I/F interface 216 sends the command or the address to each DIE on the channel to realize parallelism.

Figure 7:
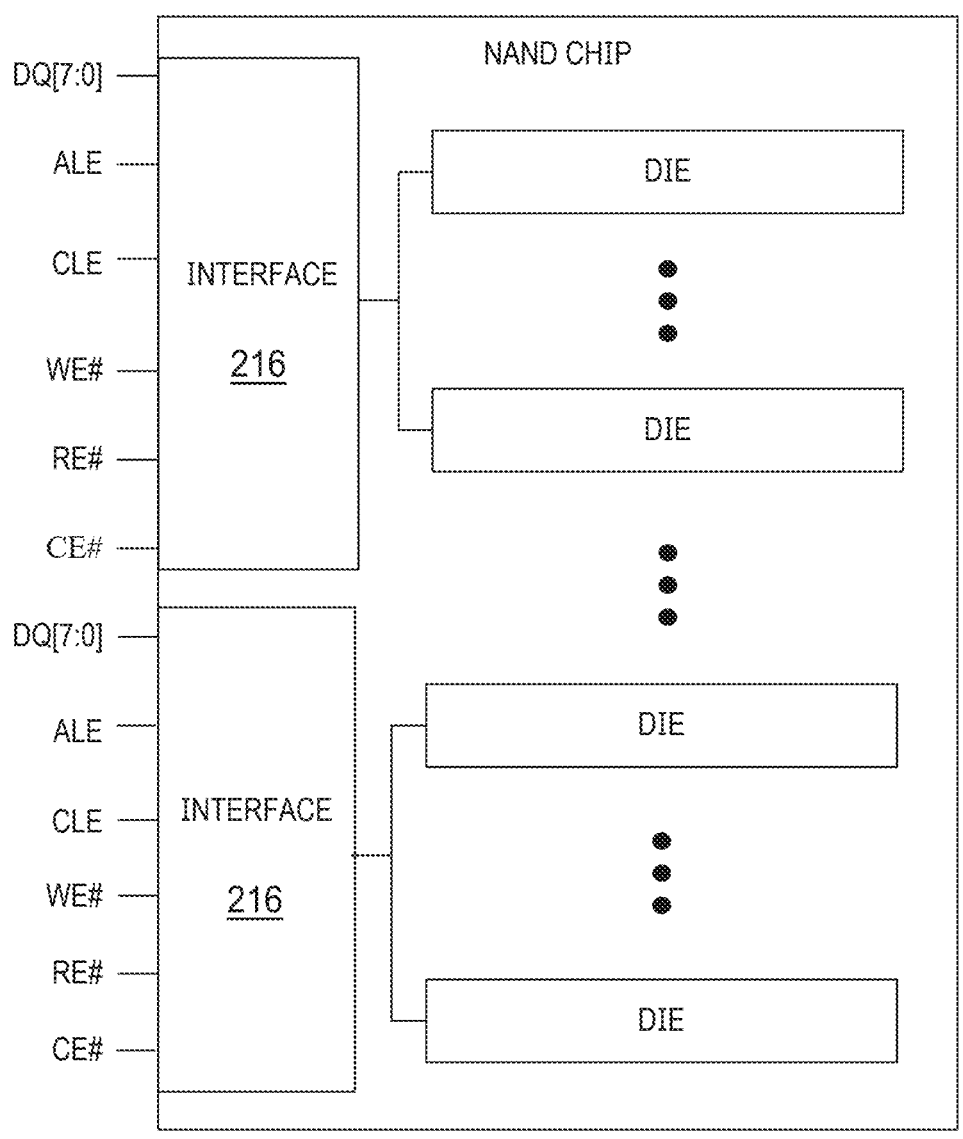
FIG. 7 is a block diagram of an interface, operating in a first mode, in a NAND chip provided by examples of the present application.

In an example, as shown in FIG. 7, the set of I/F interfaces 216 operating in the first mode correspond to 8 IO pins (i.e., DQ[7:0]) and 5 enable signal pins (ALE, CLE, WE#, RE #, CE#) of the NAND chip. Furthermore, when the memory device operates in a Double Data Rate (DDR) mode, the I/F interface 216 may also correspond to a clock pin (DQS, if it is a differential signal, two pins are included). An Address Latch Enable (ALE) signal and a Command Latch Enable (CLE) signal are used for distinguishing whether an input from the IO pin is address information or a command identifier. When commands, addresses, and data are written, WE# and CE# signals need to be pulled down at the same time, and the data is latched at a rising edge of the WE#. RE # is a read enable signal.

Figure 8:
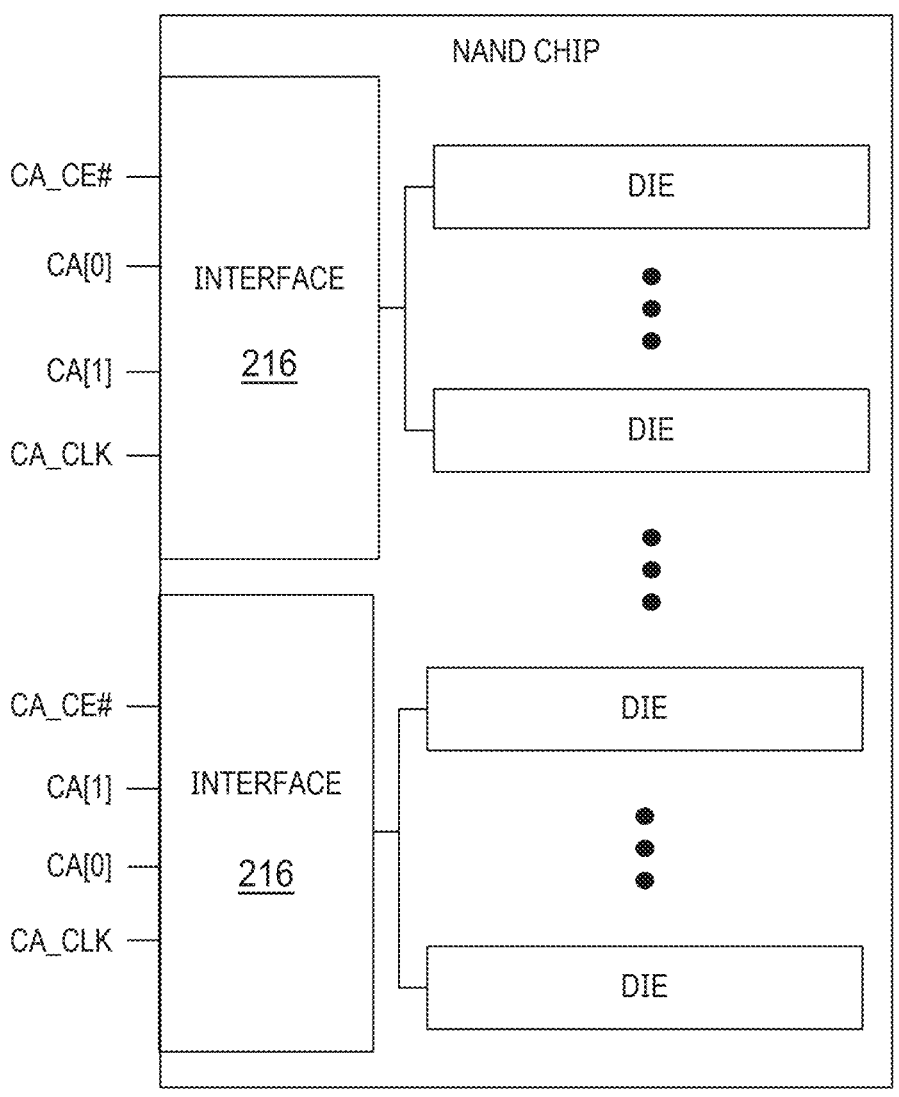
FIG. 8 is a block diagram of an interface, operating in a second mode, in a NAND chip provided by examples of the present application.

In an example, as shown in FIG. 8, the set of I/F interfaces 216 operating in a second mode correspond to four pins of the NAND chip, which respectively are CA_CE#, CA[0], CA[1], and CA_CLK. In the second mode, different SCA identifiers are employed to determine operations of the interface. These identifiers may be binary data consisting of CA[1], CA[0], CA[1], and CA[0]. Use details are described later.

It is to be noted that, FIGS. 7 and 8 only functionally show pins on the NAND chip corresponding to the interfaces operating under different protocols. For hardware, the NAND chips may be the same type of chips, and the number of pins included in the chips may be the same, and the I/F interface 216 may work in the first mode, and may also work in the second mode through configuration.

Figure 9:
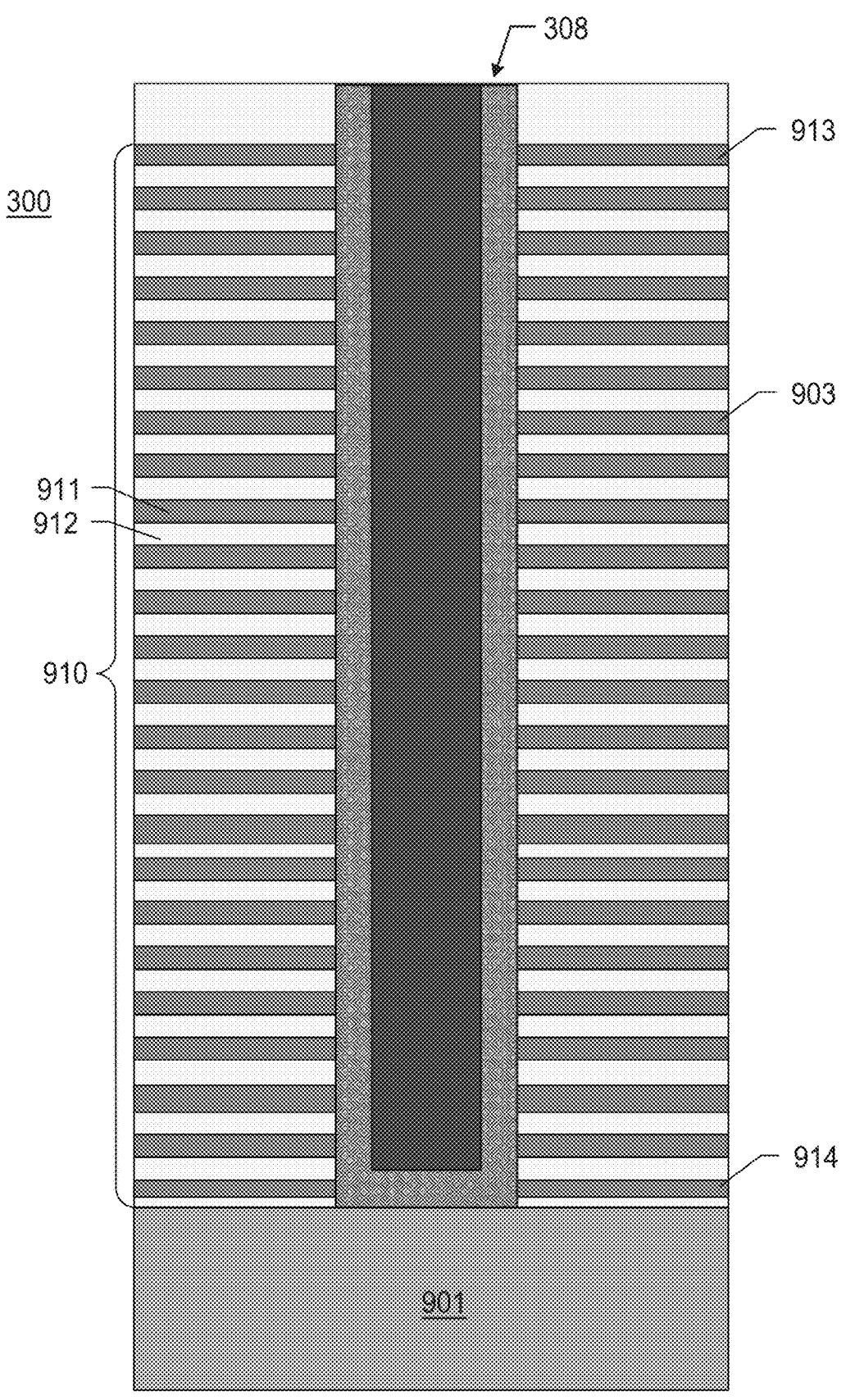
FIG. 9 is a schematic cross-sectional view of an example memory array 300 comprising NAND memory strings 308 provided by examples of the present application.

The above descriptions of the memory array are made from a usage perspective. Actually, a manufacturing structure of the memory array is shown in FIG. 9, which shows a schematic cross-sectional view of an example memory array 300 including a NAND memory string 308 provided by some aspects of the present application. As shown in FIG. 9, the NAND memory string 308 may include a stacked structure 910, which includes a plurality of gate layers 911 and a plurality of insulating layers 912 alternately stacked in sequence, and a memory string 308 penetrating vertically through the gate layers 911 and the insulating layers 912. The gate layer 911 and the insulating layer 912 can be stacked alternately, and two adjacent gate layers 911 are separated by an insulating layer 912. The number of pairs of the gate layers 911 and the insulation layers 912 in the stacked structure 910 may indicate the number of memory cells that are included in the memory array 300.

The constituent material of the gate layer 911 may include a conductive material. The conductive material may include but is not limited to tungsten (W), cobalt (Co), Copper (Cu), aluminum (Al), polysilicon, doped silicon, silicide, or any combination thereof. In some examples, each gate layer 911 may include a metal layer, e.g., a tungsten layer. In some examples, each gate layer 911 includes a doped polysilicon layer. Each gate layer 911 may include a control gate surrounding the memory cell. The gate layer 911 at the top of the stacked structure 910 may extend laterally as a top selective gate line 913, i.e., a TSG line 313. Top selective gate line 913 is a lead-out line of the top selective gate (TSG) 312 described above, so as to access a respective select voltage or deselect voltage. The gate layer 911 at the bottom of the stacked structure 410 may extend laterally as a bottom selective gate line 914, i.e., a source selective line or a bottom selective line 315. The bottom selective gate line 914 is a lead-out line of the bottom selective gate (BSG) 310 described above, so as to access a respective select voltage or deselect voltage. The gate layer 911 extending laterally between the top selective gate line and the bottom selective gate line may be used as a word line layer 903, and these word line layers 903 are the word lines 318 described above.

In some examples, the stacked structure 910 may be disposed on a substrate 901. The substrate 901 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, the NAND memory string 308 includes a channel structure extending vertically through the stacked structure 910. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Referring back to FIGS. 2 and 3, the peripheral circuit including the I/F interface 216 and the control circuit may be coupled to the memory array through the bit line 316, the word line 318, the source line 314, the source selective line or bottom selective line 315 (i.e., the bottom selective gate line 914), and the TSG line 313 (i.e., the top selective gate line 913), so as to control the memory array to perform some operations, such as writing data or reading data.

In an example, the page buffer/sense amplifier 204 can be configured to read and program (write) data from and to the memory array 201 according to the control signals from control logic 212. In one example, the page buffer/sense amplifier 204 may store a page of program data (write data) to be programmed into the memory array 201. In another example, the page buffer/sense amplifier 204 may perform program verify operations to ensure that the data has been properly programmed into memory cells 306 coupled to selected word lines 318. In still another example, the page buffer/sense amplifier 204 may also sense the low power signals from the bit line 316 that represent data bits stored in the memory cells 306 and amplify the small voltage swing to recognizable logic levels in a read operation. Column decoder/bit line driver 206 can be configured to be controlled by control logic 212 and select one or more NAND memory strings 308 by applying bit line voltages generated from the voltage generator 210.

The row decoder/word line driver 208 can be configured to be controlled by the control logic 212 and select/deselect blocks 304 of the memory array 201 and select/deselect word lines 318 of blocks 304. The row decoder/word line driver 208 can be further configured to drive word lines 318 using word line voltages generated from the voltage generator 210. In some examples, the row decoder/word line driver 208 can also select/deselect and drive source selective lines or bottom selective lines 315 and TSG lines 313 as well. The row decoder/word line driver 208 is configured to perform program operations on the memory cells 306 coupled to the selected word line(s) 318. The voltage generator 210 can be configured to be controlled by the control logic 212 and generate the word line voltages (e.g., read voltage, program voltage, pass voltage, channel boost voltage, verification voltage, etc.), bit line voltages, and source line voltages to be supplied to the memory array 201.

Herein, the control logic 212 may be coupled to each peripheral circuit described above and configured to control the operation of each peripheral circuit. Registers 214 can be coupled to the control logic 212 and include status registers, command registers, and address registers for storing status information, command operation codes (OP codes), and command addresses for controlling the operations of each peripheral circuit.

Herein, the I/F interface 216 may be coupled to the control logic 212 and act as a control buffer to buffer and relay control commands (or referred to as operation commands) received from a host (not shown) to control logic 212, and to buffer and relay status information received from the control logic 212 to the host. The I/F 216 may further be coupled to the column decoder/bit line driver 206 via the data bus 218 and act as a data I/O interface and data buffer to buffer and relay data to or from the memory array 201. For example, in the present application, the I/F interface 216 may receive a first operation command and a second operation command, relay the first operation command and the second operation command to the control logic 212 to cause the control logic 212 perform a first operation on the memory array in response to the first operation command, and turn off a first circuit in the interface that does not affect execution of the first operation in response to the second operation command.

The second operation command may include first address information. The first address information is to indicate a first die on which the first operation is performed in the memory device.

During a practical application process, the second operation command is a command that is to indicate that the memory device enters a power consumption saving state. In an example, the second operation command includes the first address information indicating the first die, and then, after the interface receives the second operation command and transmits the second operation command to the control circuit, the control circuit causes the first die to turn on the power consumption saving function (or enter the power consumption saving state) based on the first address information, so as to turn off a circuit that corresponds to the first die and may not be used in the interface when the first operation is performed. Circuits included in the first circuit are described in detail below, and are not described in detail herein again.

In combination with the above descriptions, in examples of the present application, when a respective operation (e.g., the first operation) is performed on a designated die (e.g., the first die) in the memory device, the power consumption saving function is enabled by utilizing the obtained second operation command. After the power consumption saving function is enabled, some circuits (e.g., the first circuit) that are not used in the interface when the first operation is performed on the memory array, such that the power consumption of the memory device during operating is saved.

During a practical application process, the first operation command may include second address information. The second address information is to indicate a page on which the first operation is performed in the first die, and the second address information includes the first address information.

It is to be noted that, as shown in FIG. 5, the first address information herein may only include a LUN address in row addresses. The second address information may include the LUN address, a block address, and a page address in the row addresses. That is, the first address information can only indicate a position of the first die in the memory array. The second address information may indicate pages on which the first operation is performed (the smallest unit for performing an operation is a page, and one page includes a plurality of memory cells, i.e., it indicates the memory cells on which the first operation is performed). According to the definition of the row address shown in FIG. 5, the second address information includes the first address information. That is, the page mentioned here may be the page described above.

In some examples, the interface 101 may further be configured to work in a first mode. In the first mode, the interface employs an ONFI or Toggle standard protocol to receive the first operation command and the second operation command. In the ONFI or Toggle standard protocol, an address latch enable signal is employed to determine that the interface receives the second address information included in the first operation command and the first address information included in the second operation command, and a command latch enable signal is employed to determine that the interface receives second command identifier information included in the first operation command and first command identifier information included in the second operation command.

In the first mode, the first circuit that is turned off includes at least one of the following: a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

It is to be noted that, according to different communication protocols, the interface may work in different modes, for example, in the ONFI or Toggle standard protocol, the interface operates in the first mode. Referring to a set of interfaces 216 of a NAND chip shown in FIG. 7, in the first mode, operation commands and address information are all inputted from 8 IO interfaces (i.e., DQ[7:0]). During an actual use process, whether the address information or the operation commands are received is distinguished according to different latch signals. For example, ALE is utilized to determine that the second address information included in the first operation command and the first address information included in the second operation command are received (or latched). For another example, CLE is utilized to determine that second command identifier information in the first operation command and first command identifier information in the second operation command are received (or latched). The second command identifier information may be to indicate a type of the first operation command, for example, one of the write command, read command, or erase command described above. The first command identifier information may be to indicate a function for turning off the first circuit. In some examples, the first command identifier information may be 03h.

In the case that the interface operates in the first mode, the first circuit that is turned off may include at least one of the following: a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In an example, the first circuit that is turned off is included in the interface and is the circuit that may not be used when the first operation is performed, for example, the power supply circuit of the high-speed I/O circuit corresponding to the first die, the bias circuit of the high-speed I/O circuit corresponding to the first die, and the high-speed clock duty cycle correction circuit of the high-speed I/O circuit corresponding to the first die.

Herein, the high-speed I/O circuit may refer to a digital logic circuit of which operating frequency reaches or exceeds 50 MHz. The high-speed I/O circuit corresponds to the 8 IO interfaces (i.e., DQ[7:0]) described above, and the power supply circuit, the bias circuit, and the high-speed clock duty cycle correction circuit are required to assist the high-speed I/O circuit during normal operation. During a practical application process, during the first operation is performed on the first DIE in response to the first operation command, the circuits, such as the power supply circuit, the bias circuit, and the high-speed clock duty cycle correction circuit, related to the high-speed I/O circuit included in the interface may not be used. Therefore, during this process, if these circuits are turned off, power consumption can be saved.

In some other examples, the interface is further configured to work in a second mode. In the second mode, the interface employs a separate command address SCA protocol to receive the first operation command and the second operation command.

In the SCA protocol, a first identifier is employed to determine that the interface receives the second address information included in the first operation command and the first address information included in the second operation command, and a second identifier is employed to determine that the interface receives second command identifier information included in the first operation command and first command identifier information included in the second operation command The first identifier is different from the second identifier.

Furthermore, in the second mode, the first circuit that is turned off includes at least one of the following: a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the interface may further be configured to work in a second mode. In the second mode, referring to FIG. 8, the interface is configured to employ the SCA protocol for communication, and only four pins are used, which respectively are CA_CE#, CA[0], CA[1], and CA_CLK. In the second mode, different SCA identifiers are employed to determine operations of the interface. These identifiers may be binary data consisting of CA[1], CA[0], CA[1], and CA[0].

For example, in examples of the present application, a first identifier is employed to determine that the interface receives the second address information included in the first operation command and the first address information included in the second operation command, and a second identifier is employed to determine that the interface receives second command identifier information included in the first operation command and first command identifier information included in the second operation command. The first identifier is different from the second identifier, for example, the first identifier may be 0100 in binary, and the second identifier may be 1000 in binary.

It is to be noted that, actually, there are other SCA identifiers, which are all defined in the SCA protocol, and the details are not described herein again.

In the case that the interface operates in the second mode, the first circuit that is turned off may include at least one of the following: a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

That is, compared with operating in the first mode, when the interface operates in the second mode, the first circuit that is turned off further includes the high-speed I/O circuit corresponding to the first die. Under the SCA protocol, when the first operation is performed on the first die, data transmission thereof may also be determined according to the SCA identifiers. For example, when an identifier is 0010 in binary, it indicates that the interface receives data (i.e., an input of the data, which also enters from CA[0] and CA[1]), such that, when the first operation is performed on the first die, the high-speed IO circuit may not be used, i.e., may be turned off.

In some examples, the second operation command may further include third address information. The third address information is to indicate a second die on which the first operation is not performed in the memory device.

That is, the second operation command may further include the third address information indicating a second die on which the first operation is not performed in the memory device, that is, based on the method of saving power consumption by turning off the circuits that may not be used as provided by the examples of the present application, the circuits corresponding to the dies on which the first operation is not performed may also be turned off, such that power consumption can be saved to a greater extent. It is to be noted that, according to the flash chip described in FIG. 6, one or more dies included in one channel share the interface 216, and then the first die described above may include one or more dies. Furthermore, the second die and the first die do not belong to the same channel. That is, the first operation is performed on all LUNs of the same channel, and only one interface 101 is included, such that the first circuit in the interface 216 corresponding to the channel may be turned off. The second die may include LUNs of a plurality of different channels, each channel may also include one or more dies, and these channels and the first die do not belong to the same channel. Herein, in order to save power consumption to a greater extent, during execution of the first operation on the first die, some circuits in the second die that belongs to a different channel from the first die may also be turned off.

In an example, in one example, the interface may further be configured to work in a first mode. In the first mode, the interface employs an ONFI or Toggle standard protocol to receive the first operation command and the second operation command. The first circuit that is turned off may include at least one of the following: power supply circuits of high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

In some other examples, the interface is further configured to work in a second mode. In the second mode, the interface employs a separate command address SCA protocol to receive the first operation command and the second operation command. The first circuit that is turned off may include at least one of the following: high-speed I/O circuits corresponding to the first die and the second die in the memory device; power supply circuits of the high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

It is to be noted that, when the second operation command further includes the third address information, regardless of whether the interface operates in the first mode or the second mode, the first circuit that is turned off should include a circuit related to the high-speed I/O circuit corresponding to the first die and a circuit related to the high-speed I/O circuit corresponding to the second die. It is to be noted that, the first die and the second die described here are only used to distinguish the dies on which the first operation is performed and the dies on which the first operation is not performed, and are not a limitation on the number.

In examples of the present application, the first operation command is followed by the second operation command, and the second operation command is used to enable the power consumption saving function of a particular die or a plurality of dies (turning off some circuits that may not be used during operation execution); and then, the third operation command is utilized to cause these dies exit the power consumption saving function to recover normal use of the above-mentioned circuits that are turned off, so as to not affect other operations of the memory device.

Figure 10:
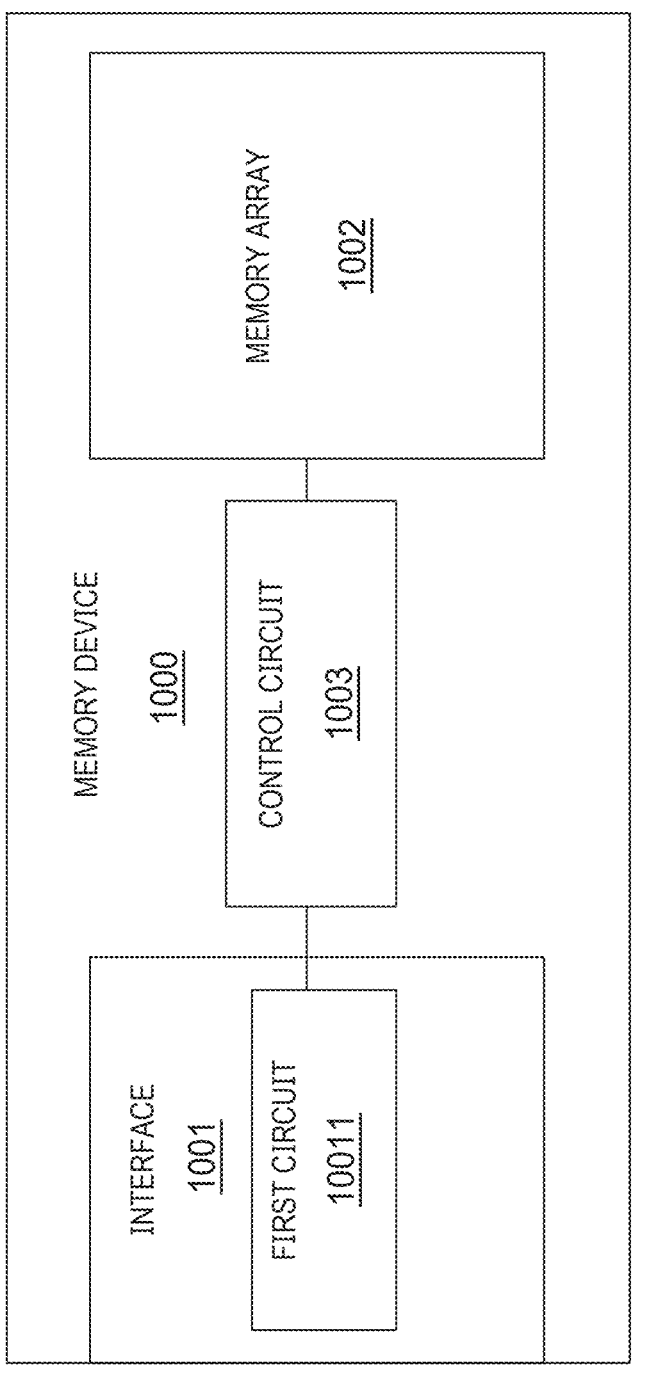
FIG. 10 is a schematic structural diagram of a memory device provided by examples of the present application.

As shown in FIG. 10, examples of the present application further provide a memory device 1000, including an interface 1001, a memory array 1002, and a control circuit 1003.

The interface 1001 is configured to receive a first operation command and a second operation command.

The control circuit 1003 is connected with the interface and the memory array 1002 respectively and configured to: perform a first operation on the memory array in response to the first operation command; and turn off a first circuit 10011 in the interface 1001 in response to the second operation command. The first circuit includes a circuit that may not be used when the first operation is performed on the memory device.

The interface 1001 is further configured to receive a third operation command.

The control circuit 1003 is further configured to turn on the first circuit in response to the third operation command.

In some examples, the first operation command includes one of the following: a read command; a write command; or an erase command. In some examples, the first operation includes one of the following: a read operation; a write operation; or an erase operation.

In some examples, the memory array includes a plurality of dies, and each die includes a plurality of pages. The second operation command includes first address information indicating a first die on which the first operation is performed in the memory array. The first operation command includes second address information including the first address information and indicating a page on which the first operation is performed in the first die, and the second address information.

In some examples, the interface is further configured to work in a first mode. In the first mode, the interface employs an ONFI or Toggle standard protocol to receive the first operation command and the second operation command. In the ONFI or Toggle standard protocol, an address latch enable signal is employed to determine that the interface receives the second address information included in the first operation command and the first address information included in the second operation command, and a command latch enable signal is employed to determine that the interface receives second command identifier information included in the first operation command and first command identifier information included in the second operation command.

In some examples, in the first mode, the first circuit that is turned off includes at least one of the following: a power supply circuit of a high-speed I/O circuit corresponding to the first die in the interface; a bias circuit of the high-speed I/O circuit corresponding to the first die in the interface; or a high-speed clock duty cycle correction circuit of the high-speed I/O circuit corresponding to the first die in the interface.

In some examples, the interface is further configured to work in a second mode. In the second mode, the interface employs a separate command address SCA protocol to receive the first operation command and the second operation command. In the SCA protocol, a first identifier is employed to determine that the interface receives the second address information included in the first operation command and the first address information included in the second operation command, and a second identifier is employed to determine that the interface receives second command identifier information included in the first operation command and first command identifier information included in the second operation command. The first identifier is different from the second identifier.

In some examples, in the second mode, the first circuit that is turned off includes at least one of the following: a high-speed I/O circuit corresponding to the first die in the interface; a power supply circuit of the high-speed I/O circuit corresponding to the first die in the interface; a bias circuit of the high-speed I/O circuit corresponding to the first die in the interface; or a high-speed clock duty cycle correction circuit of the high-speed I/O circuit corresponding to the first die in the interface.

In some examples, the second operation command further includes third address information. The third address information is to indicate a second die on which the first operation is not performed in the memory array.

In some examples, the interface is further configured to work in a first mode. In the first mode, the interface employs an ONFI or Toggle standard protocol to receive the first operation command and the second operation command. The first circuit that is turned off includes at least one of the following: power supply circuits of high-speed I/O circuits corresponding to the first die and the second die in the interface; bias circuits of the high-speed I/O circuits corresponding to the first die and the second die in the interface; or high-speed clock duty cycle correction circuits of the high-speed I/O circuits corresponding to the first die and the second die in the interface.

In some examples, the interface is further configured to work in a second mode. In the second mode, the interface employs a separate command address SCA protocol to receive the first operation command and the second operation command. The first circuit that is turned off includes at least one of the following: high-speed I/O circuits corresponding to the first die and the second die in the interface; power supply circuits of the high-speed I/O circuits corresponding to the first dic and the second die in the interface; bias circuits of the high-speed I/O circuits corresponding to the first die and the second die in the interface; or high-speed clock duty cycle correction circuits of the high-speed I/O circuits corresponding to the first die and the second die in the interface.

In some examples, the memory device provided by the examples of the present application includes the interface described above, that is, the interface 1001 described here is functionally and structurally identical to the interface 101 described above, and is only named differently in describing different structures (e.g., describing two different structures of the interface and the memory device), so as to distinguish between different examples. The interface 1001 may receive the first operation command, the second operation command, and the third operation command, and utilize a control circuit to realize the first operation and the enabling and disabling of the power consumption saving function, and so on. In addition, the first operation and the power consumption saving function have already been described in detail above, and thus are not described herein again.

Figure 11:
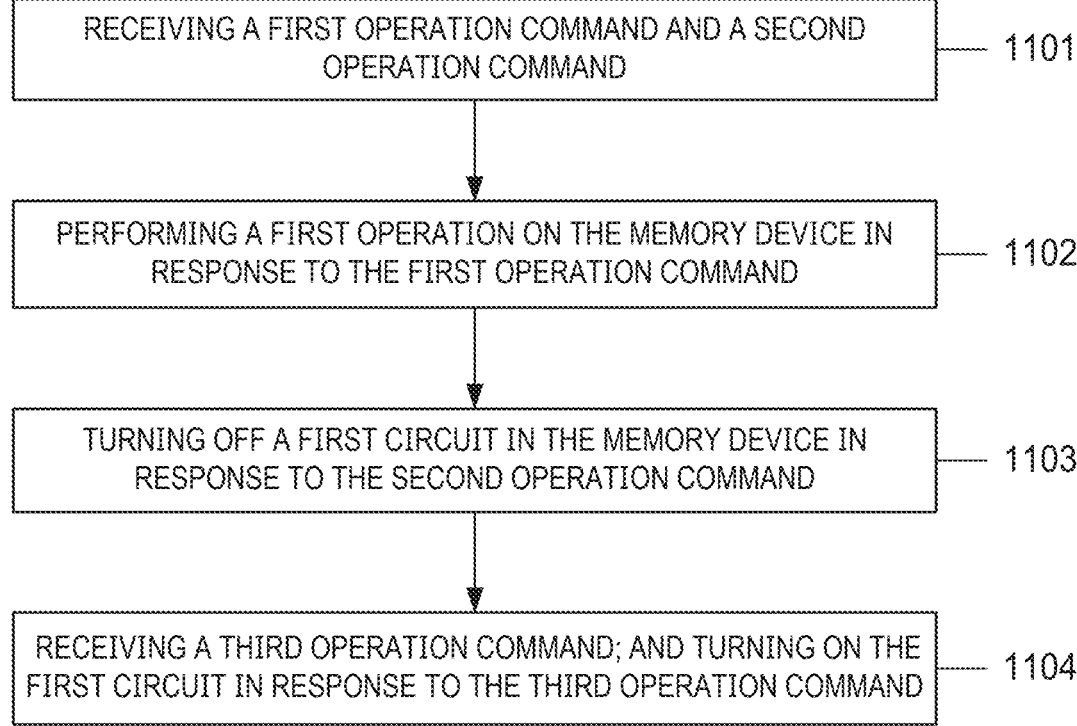
FIG. 11 is a flow diagram of a method of operating a memory device provided by examples of the present application.

As shown in FIG. 11, examples of the present application further provide a method of operating a memory device. The method includes as follows.

Operation 1101 may includes receiving a first operation command and a second operation command.

Operation 1102 may includes performing a first operation on the memory device in response to the first operation command.

Operation 1103 may includes turning off a first circuit in the memory device in response to the second operation command.

Operation 1104 may includes receiving a third operation command; and turning on the first circuit in response to the third operation command.

The first circuit includes a circuit that may not be used when the first operation is performed.

In some examples, the first operation command includes one of the following a read command; a write command; or an erase command. The first operation includes one of the following a read operation; a write operation; or an erase operation.

In some examples, the second operation command includes first address information. The first address information is to indicate a first die on which the first operation is performed in the memory device. The first operation command includes second address information. The second address information is to indicate a page on which the first operation is performed in the first die, and the second address information includes the first address information.

In some examples, the method includes employing an ONFI or Toggle standard protocol to receive the first operation command and the second operation command; or employing a separate command address SCA protocol to receive the first operation command and the second operation command.

In some examples, in the case of employing an ONFI or Toggle standard protocol to receive the first operation command and the second operation command, the first circuit that is turned off includes at least one of the following: a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, in the case of employing a separate command address SCA protocol to receive the first operation command and the second operation command, the first circuit that is turned off includes at least one of the following: a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the second operation command further includes third address information. The third address information is to indicate a second die on which the first operation is not performed in the memory device.

In some examples, in the case of employing an ONFI or Toggle standard protocol to receive the first operation command and the second operation command, the first circuit that is turned off includes at least one of the following: power supply circuits of high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

In some examples, in the case of employing a separate command address SCA protocol to receive the first operation command and the second operation command, the first circuit that is turned off includes at least one of the following: high-speed I/O circuits corresponding to the first die and the second die in the memory device; power supply circuits of the high-speed I/O circuits corresponding to the first die and the second die in the memory device; bias circuits of the high-speed I/O circuits corresponding to the first die and the second die in the memory device; or high-speed clock duty cycle correction circuits of the high-speed I/O circuits corresponding to the first die and the second die in the memory device.

It is to be noted that, the method of operating a memory device provided by the examples of the present application aims at the memory device described above. Furthermore, features shown in the operations have already been described in detail above, and thus not described herein again.

Figure 12:
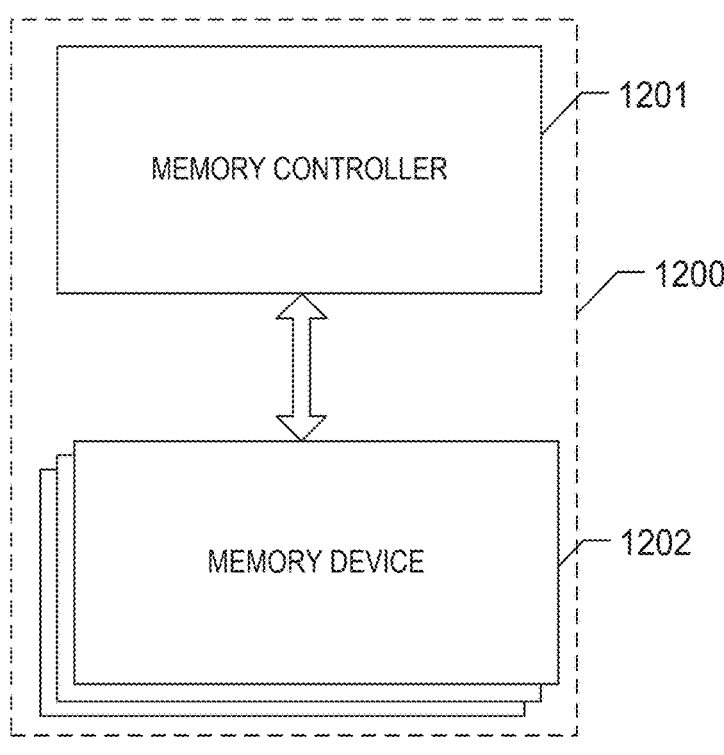
FIG. 12 is a schematic structural diagram of a memory system provided by examples of the present application.

As shown in FIG. 12, examples of the present application further provide a memory system 1200. The memory system 1200 includes a memory controller 1201 and a memory device 1202 coupled with the memory controller 1201. The memory controller 1201 is configured to send a first operation command and a second operation command.

The memory device is configured to receive the first operation command and the second operation command. The first operation command is to indicate to perform a first operation on the memory device, the second operation command is to indicate to turn off a first circuit in the memory device, and the first circuit includes a circuit that may not be used when the first operation is performed on the memory device.

The memory controller is further configured to send a third operation command when a preset condition is met.

The memory device is further configured to receive the third operation command indicating to turn on the first circuit.

Figure 13:
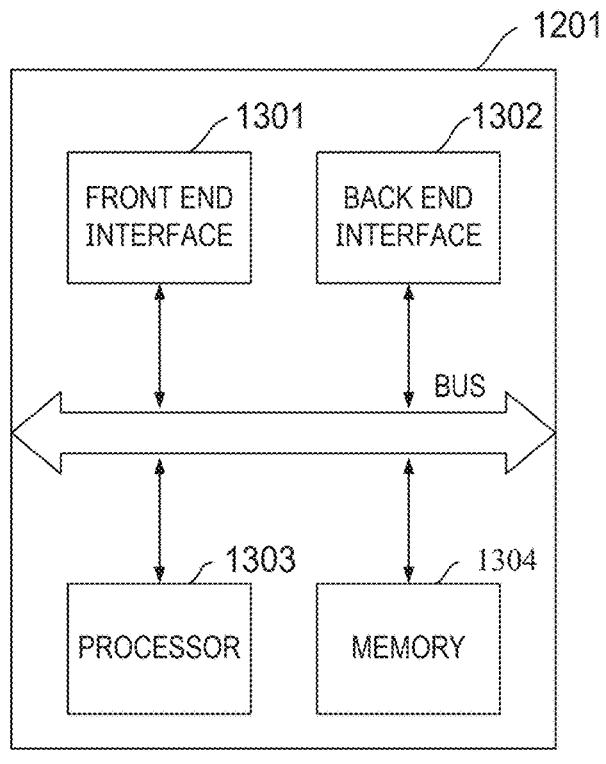
FIG. 13 is a schematic structural diagram of a memory controller provided by examples of the present application.

In some examples, as shown in FIG. 13, the memory controller 1201 may include a front end interface 1301, a back end interface 1302, a processor 1303, and a memory 1304. The above-mentioned components 1301, 1302, 1303, and 1304 in the memory controller 1201 may share a transmission signal in the memory controller 1201 through internal buses. In some examples, the front end interface 1301 may connect a host with an interface of the memory system 1200 in response to a protocol of the host coupled with the memory system 1200, and the front end interface 1301 exchanges transmission commands and data operations between the host and the memory system 1200. The front end interface 1301 may process commands and data sent by the host, and may include at least one of the following: a Universal Serial Bus (USB), a Multi-Media Card (MMC), a Peripheral Component Interconnection-Express (PCI-e or PCIe), a Small Computer System Interface (SCSI), a Serial SCSI (SAS), a Serial Advanced Technology Attachment (SATA), a Parallel Advanced Technology Attachment (PATA), a Small Computer System Interface (SCSI), an Enhanced Small Disk Interface (ESDI), and an Integrated Drive Electronic (IDE). In some examples, the front end interface 1301 is a component of the memory system 1200 for exchanging data with the host, and may be implemented by firmware called a host interface layer (HIL).

The back end interface 1302 may be an interface for transmitting commands and data between the memory controller 1201 and the coupled memory device, allowing the memory controller 1201 to control the coupled memory device in response to a request transmitted from the host. The back end interface 1302 may generate a control signal for controlling the coupled memory device. In some examples, if the coupled memory device is a NAND flash memory, the back end interface 1302 may write or read data to or from the coupled memory device under the control of the processor 1303. The back end interface 1302 may process the commands and data between the memory controller 1201 and the coupled memory device, for example, operations of the NAND flash interface, especially operations between the memory controller 1201 and the coupled memory device. According to examples, through firmware known as a flash interface layer (FIL), the back end interface 1302 may be implemented as the component for exchanging data with the coupled memory device.

The processor 1303 may be implemented as a microprocessor or a central processing unit (CPU). The memory system 1200 may include one or more processors 1303. The processor 1303 can control all operations of the memory system 1200. By way of example instead of limitation, the processor 1303 may control program operations or read operations of the coupled memory device in response to a write request or a read request from the host. According to examples, the processor 1303 may use or run the firmware to control all operations of the memory system 1200. In the present disclosure, the firmware may be referred to as a flash translation layer (FTL). The FTL may be used as an interface between the host and the coupled memory device to execute the operations. The host may transmit requests related to the write operation and the read operation to the coupled memory device. For example, when the operation request by the host is performed in the coupled memory device, the memory controller 1201 uses the processor 1303. The processor 1303 coupled with the coupled memory device may process instructions or commands related to the commands from the host. The memory controller 1201 may execute a foregrounding operation of a command operation corresponding to the command inputted from the host, for example, a program operation corresponding to a write command, a read operation corresponding to a read command, an erase/discard operation corresponding to an erase/discard command, and a parameter setting operation corresponding to a setting parameter command or a setting feature command having a setting command.

For another example, the memory controller 1201 may execute a background operation on the coupled memory device through the processor 1303. By way of example instead of limitation, these background operations include a garbage collection (GC) operation, a wear leveling (WL) operation, and a bad block management operation to check or search for bad blocks. The garbage collection operation may include an operation of replicating and processing data stored in a block in the memory device to another block. The wear leveling operation may include an operation of exchanging and processing the stored data between the blocks of the memory device. The bad block management operation may include checking and processing bad blocks in the blocks of the coupled memory device.

The memory 1304 may be a working memory of the memory controller 1201, and is configured to store data for driving the memory controller 1201. In an example, when the memory controller 1201 controls the memory device in response to a request of the host, the memory 1304 may store firmware driven by the processor 1303 and data (such as metadata) required for driving the firmware.

The memory 1304 may also be a buffer memory of the memory controller 1201, and is configured to temporarily store write data transmitted from the host to the coupled memory device, and read data transmitted from the coupled memory device to the host. The memory 1304 may include a program memory for storing the write data and the read data, a data memory, a write buffer/cache, a read buffer/cache, a data buffer/cache, and a mapping buffer/cache. The memory 1304 may be implemented by utilizing a volatile memory. The memory 1304 may be implemented by utilizing a static random access memory (SRAM), a dynamic random access memory (DRAM), or both.

Although FIG. 13 shows that the memory 1304 is included in the memory controller 1201, the present disclosure is not limited thereto. In implementations, the memory 1304 may be included externally to the memory controller 1201, and the memory controller 1201 may input and output data to the memory 1304 through a separate memory interface (not shown). In some examples, a portion of space is divided in the memory of the host and provided to an SSD for use, and the memory controller of the SSD calls a portion of the memory of the host for its own use through the front end interface, i.e., a host memory buffer (HBM) technology.

In examples of the present application, the processor 1303 of the memory controller sends the first operation command and the second operation command to the memory device through the back end interface 1302. Furthermore, when a preset condition is met, the processor of the memory controller sends the third operation command to the memory device through the back end interface 1302 according to some judgments.

In some examples, the memory device includes an interface. The interface is configured to work in a first mode or a second mode. In the first mode, the interface employs an ONFI or Toggle standard protocol to receive the first operation command, the second operation command, and the third operation command, and in the second mode, the interface employs a separate command address SCA protocol to receive the first operation command, the second operation command, and the third operation command.

In some examples, the second operation command includes first address information. The first address information is to indicate a first die on which the first operation is performed in the memory device.

In some examples, in the first mode, the first circuit that is turned off includes at least one of the following: a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, in the second mode, the first circuit that is turned off includes at least one of the following: a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the second operation command further includes third address information. The third address information is to indicate a second die on which the first operation is not performed in the memory device. In the first mode, the first circuit that is turned off includes at least one of the following: a power supply circuit of a high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In the second mode, the first circuit that is turned off includes at least one of the following: a high-speed I/O circuit corresponding to the first die in the memory device; a power supply circuit of the high-speed I/O circuit corresponding to the first die in the memory device; a bias circuit of the high-speed I/O circuit corresponding to the first die in the memory device; or a high-speed clock duty cycle correction circuit of the high-speed I/O circuit corresponding to the first die in the memory device.

In some examples, the meeting the preset condition includes one of the following: in the case that the first operation command includes a read command and the first operation includes a read operation, before the memory device feeds back read data in response to the read command; in the case that the first operation command includes a write command and the first operation includes a write operation, the memory device completes the write operation in response to the write command; or in the case that the first operation command includes an erase command and the first operation includes an erase operation, the meeting the preset condition includes: the memory device completes the erase operation in response to the erase command.

It is to be noted that, in the memory system provided by the examples of the present application, descriptions for the first operation command and the second operation command have been described in detail above, and thus are not described herein again. The third operation command is only sent by the memory controller when the preset condition is met. The meeting the preset condition may include one of the following: in the case that the first operation command includes a read command and the first operation includes a read operation, before the memory device feeds back read data in response to the read command; in the case that the first operation command includes a write command and the first operation includes a write operation, the memory device completes the write operation in response to the write command; or in the case that the first operation command includes an erase command and the first operation includes an erase operation, the memory device completes the erase operation in response to the erase command. It is to be understood that, after the memory controller sends the operation command, waiting time is set, and within the set waiting time, the memory device feeds back corresponding results and states. For example, during the read operation, the memory controller obtains read data within the set waiting time, and after the power consumption saving function is enabled, transmission of the read data is not delayed by sending the third operation command before the set time, such that in the case that the first operation command includes the read command and the first operation includes the read operation, and before the memory device feeds back the read data in response to the read command, the memory controller will send the third operation command. For the time of sending, it can be set according to actual situations, as long as it does not affect the execution of read operations and the transmission of read data. For the write operation and the erase operation, no data feedback to the memory controller is required, so it is sufficient to turn them on after completion.

In some examples, the memory system is included in a Solid State Disk (SSD) or a memory card.

It is to be noted that, the memory system 1200 may be provided with one or more memory devices and a memory controller. The memory controller may control the memory device in response to a request of the host. For example, the memory controller may read data from the memory device, and transmit the read data to the host; and the memory controller may also receive data to be stored from the host, and store the data to be stored to the memory device. That is, the memory controller can control the write (or program) operation, the read operation, the erase operation, the background operation, and the like of the memory device. Furthermore, the memory system 1200 may be implemented and packaged into different types of end electronic products. In one example, the memory controller and the single memory device may be integrated into a memory card. The memory card may include a PC card (PCMCIA, Personal Computer Memory Card International Association), a CF card, a Smart Media (SM) card, a memory stick, a Multimedia card (MMC, RS-MMC, MMCmicro), an SD card (SD, miniSD, microSD, SDHC), a UFS, etc. The memory card may further include a memory card connector coupling the memory card with the host. In another example, the memory controller and the plurality of memory devices may be integrated into the SSD. The SSD may further include an SSD connector coupling the SSD with the host. In some implementations, at least one of the storage capacity or operation speed of the SSD is greater than that of the memory card.

In order to understand the present application, the following is described by examples.

Figure 14:
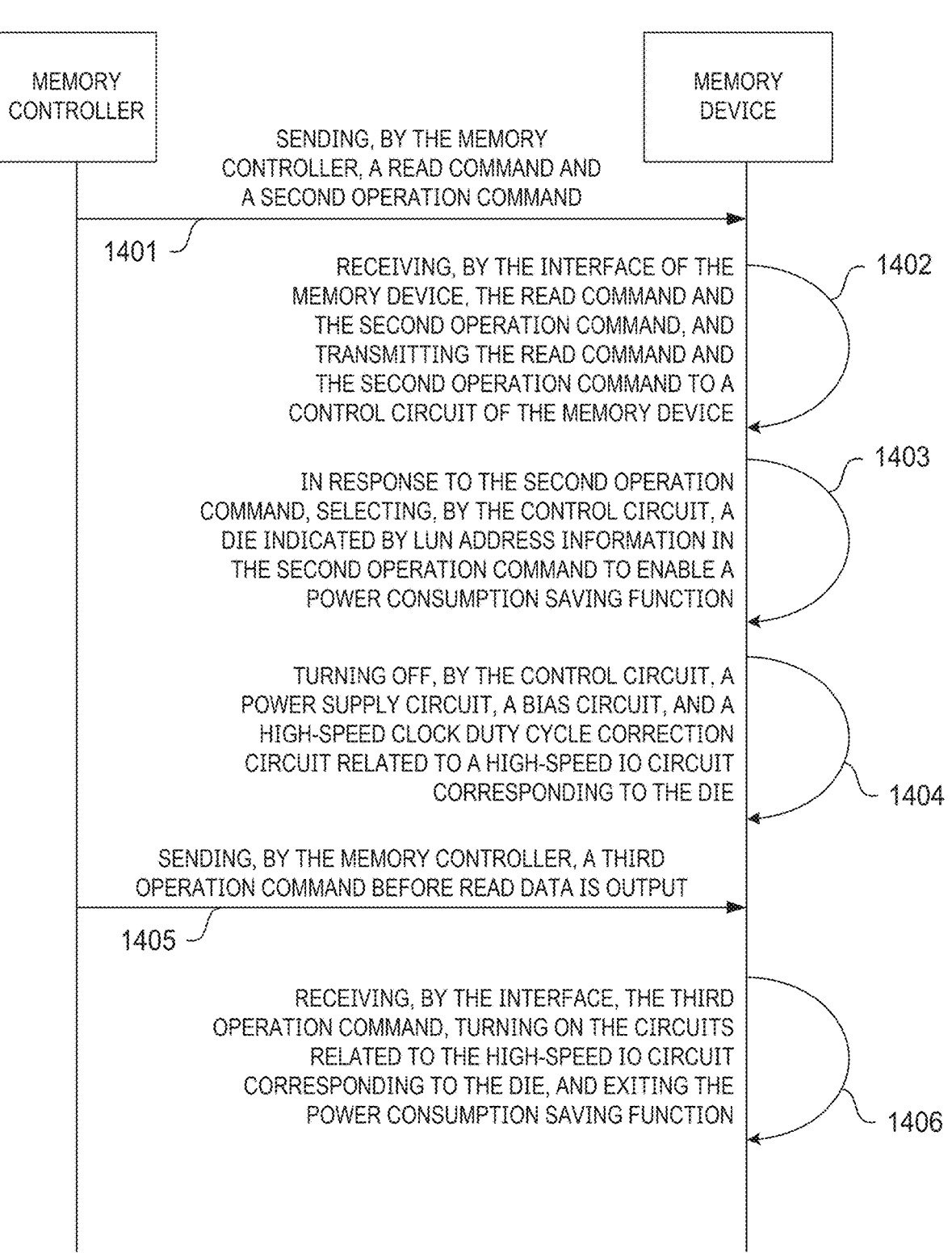
FIG. 14 is a flow diagram of realizing the enabling and disabling of a power consumption saving function through an interaction between a memory device and a memory controller when an interface of the memory device operates in a first mode and a first operation is a read operation provided by examples of the present application.

FIG. 14 shows a flow diagram I in a memory system to realize operations of examples of the present application. In FIG. 14, the memory system includes a memory controller and a memory device, and an interface of the memory device operates in a first mode and a first operation is a read operation.

Based on this, the flow may include the following operations.

Operation 1401: sending, by the memory controller, a read command and a second operation command.

Herein, a sending format of the second operation command may include an identifier (such as 03h) and first address information. Alternatively, the sending format of the second operation command may include the identifier (such as 03h) and the first address information and third address information.

Operation 1402: receiving, by the interface of the memory device, the read command and the second operation command, and transmitting the read command and the second operation command to a control circuit of the memory device.

Operation 1403: in response to the second operation command, selecting, by the control circuit, a die indicated by LUN address information (e.g., the first address information or/and the third address information) in the second operation command to enable a power consumption saving function.

Operation 1404: turning off, by the control circuit, a power supply circuit, a bias circuit, and a high-speed clock duty cycle correction circuit related to a high-speed IO circuit corresponding to the die.

Operation 1405: sending, by the memory controller, a third operation command before read data is output.

Operation 1406: receiving, by the interface, the third operation command, turning on the circuits related to the high-speed IO circuit corresponding to the die, and exiting the power consumption saving function.

A sending format of the third operation command may include an identifier (such as 04h) and the first address information. Alternatively, the sending format of the second operation command may include the identifier (such as 04h) and the first address information and third address information.

It is to be noted that, the power supply circuit described here is a power supply circuit of the high-speed IO circuit during normal operation, for example, 1.7 volts (V). In this case, the high-speed IO circuit is in a standby mode, and is still partially powered, for example, 1.65 V.

Figure 15:
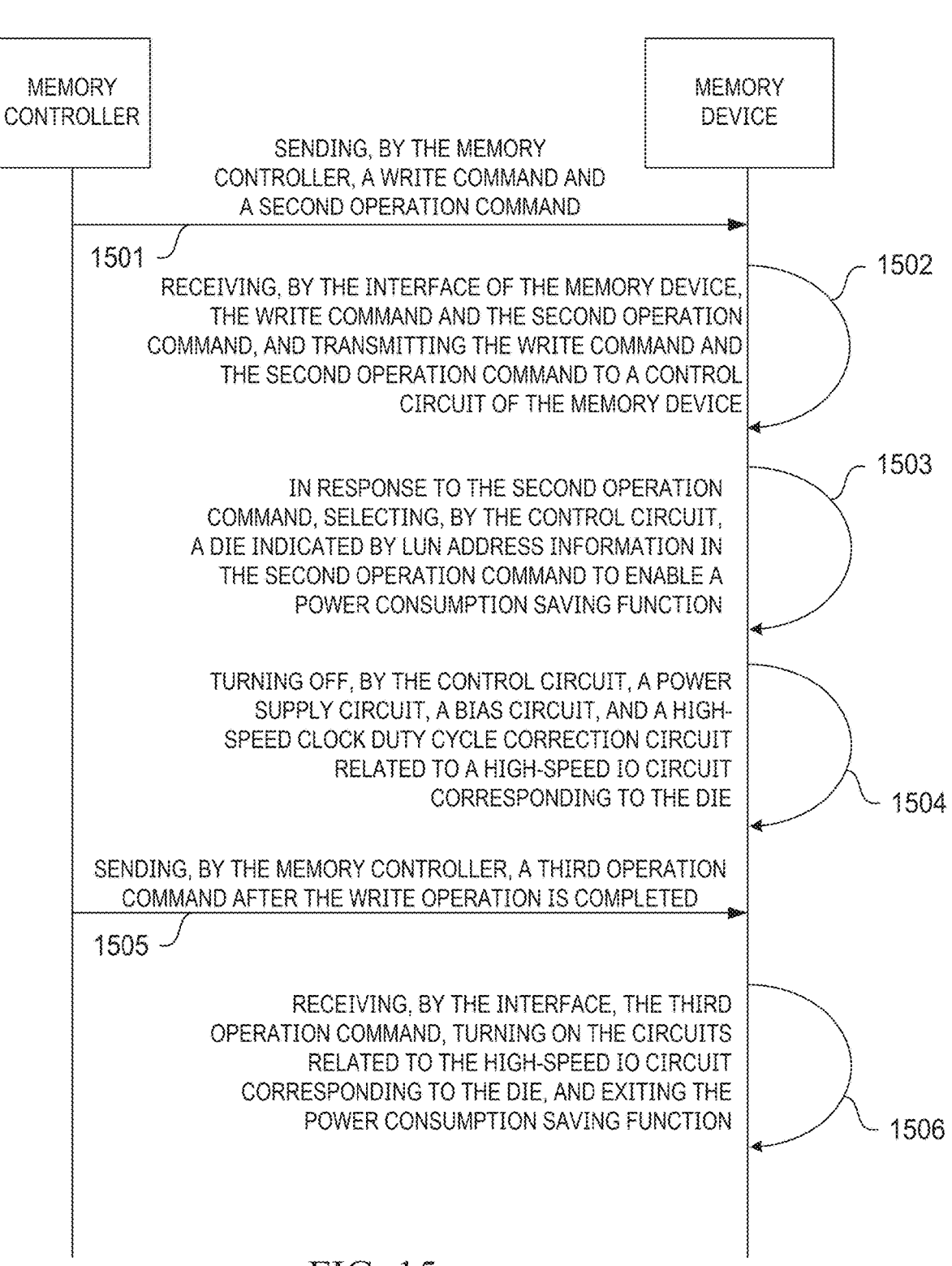
FIG. 15 is a flow diagram of realizing the enabling and disabling of a power consumption saving function through an interaction between a memory device and a memory controller when an interface of the memory device operates in a first mode and a first operation is a write operation provided by examples of the present application.

FIG. 15 shows a flow diagram II in a memory system to realize operations of examples of the present application. In FIG. 15, the memory system includes a memory controller and a memory device, and an interface of the memory device operates in a first mode and a first operation is a write operation.

Based on this, the flow may include the following operations.

Operation 1501: sending, by the memory controller, a write command and a second operation command.

Herein, a sending format of the second operation command may include an identifier (such as 03h) and first address information. Alternatively, the sending format of the second operation command may include the identifier (such as 03h) and the first address information and third address information.

Operation 1502: receiving, by the interface of the memory device, the write command and the second operation command, and transmitting the write command and the second operation command to a control circuit of the memory device.

Operation 1503: in response to the second operation command, selecting, by the control circuit, a die indicated by LUN address information in the second operation command to enable a power consumption saving function.

Operation 1504: turning off, by the control circuit, a power supply circuit, a bias circuit, and a high-speed clock duty cycle correction circuit related to a high-speed IO circuit corresponding to the die.

Operation 1505: sending, by the memory controller, a third operation command after the write operation is completed.

Operation 1506: receiving, by the interface, the third operation command, turning on the circuits related to the high-speed IO circuit corresponding to the die, and exiting the power consumption saving function.

A sending format of the third operation command may include an identifier (such as 04h) and the first address information. Alternatively, the sending format of the second operation command may include the identifier (such as 04h) and the first address information and third address information. It is to be noted that, the power supply circuit described here is a power supply circuit of the high-speed IO circuit during normal operation, for example, 1.7 volts (V). In this case, the high-speed IO circuit is in a standby mode, and is still partially powered, for example, 1.65 V.

Figure 16:
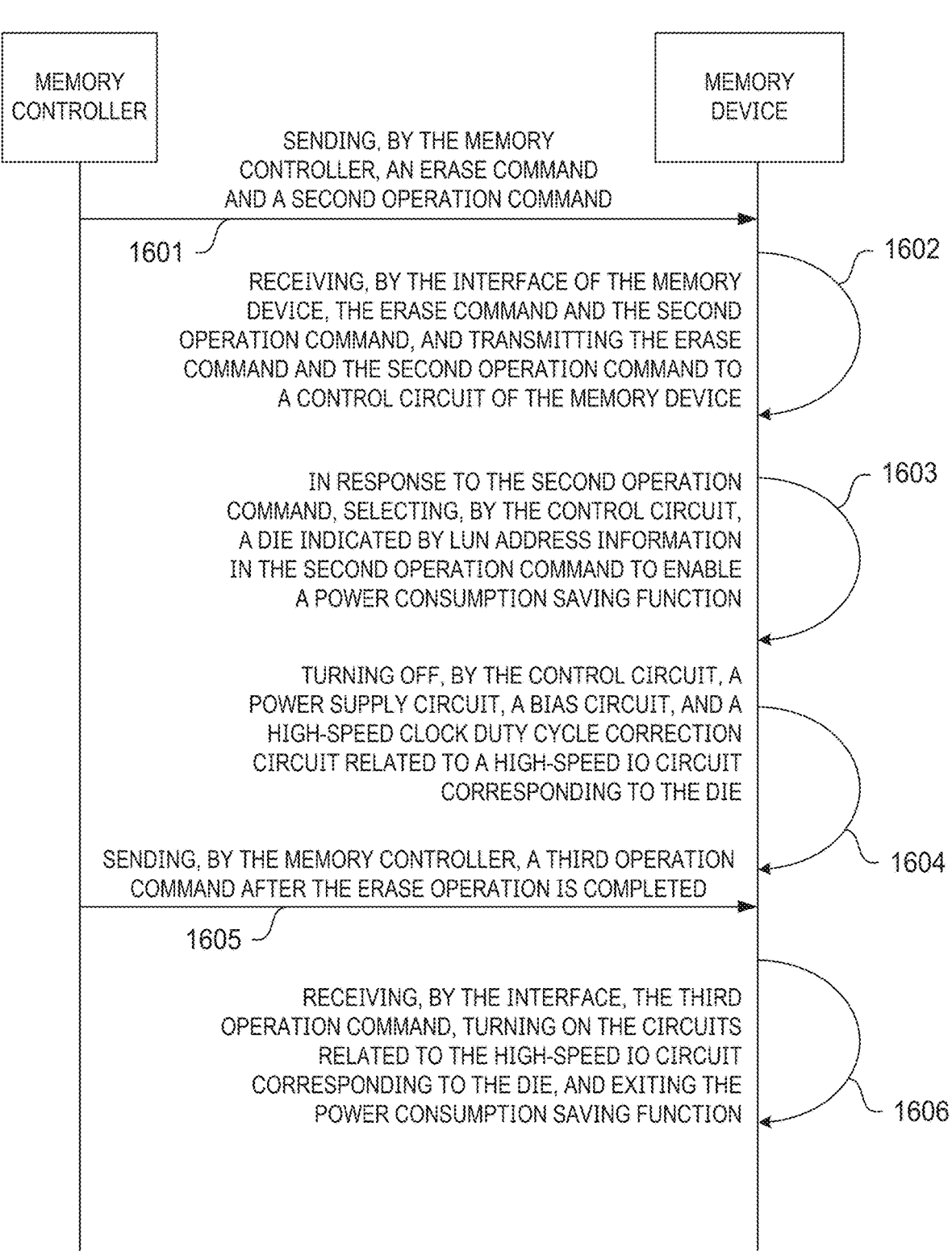
FIG. 16 is a flow diagram of realizing the enabling and disabling of a power consumption saving function through an interaction between a memory device and a memory controller when an interface of the memory device operates in a first mode and a first operation is an erase operation provided by examples of the present application.

FIG. 16 shows a flow diagram III in a memory system to realize operations of examples of the present application. In FIG. 16, the memory system includes a memory controller and a memory device, and an interface of the memory device operates in a first mode and a first operation is an erase operation.

Based on this, the flow may include the following operations.

Operation 1601: sending, by the memory controller, an erase command and a second operation command.

Herein, a sending format of the second operation command may include an identifier (such as 03h) and first address information. Alternatively, the sending format of the second operation command may include the identifier (such as 03h) and the first address information and third address information.

Operation 1602: receiving, by the interface of the memory device, the erase command and the second operation command, and transmitting the erase command and the second operation command to a control circuit of the memory device.

Operation 1603: in response to the second operation command, selecting, by the control circuit, a die indicated by LUN address information in the second operation command to enable a power consumption saving function.

Operation 1604: turning off, by the control circuit, a power supply circuit, a bias circuit, and a high-speed clock duty cycle correction circuit related to a high-speed IO circuit corresponding to the die.

Operation 1605: sending, by the memory controller, a third operation command after the erase operation is completed.

Operation 1606: receiving, by the interface, the third operation command, turning on the circuits related to the high-speed IO circuit corresponding to the die, and exiting the power consumption saving function.

A sending format of the third operation command may include an identifier (such as 04h) and the first address information. Alternatively, the sending format of the second operation command may include the identifier (such as 04h) and the first address information and third address information. It is to be noted that, the power supply circuit described here is a power supply circuit of the high-speed IO circuit during normal operation, for example, 1.7 volts (V). In this case, the high-speed IO circuit is in a standby mode, and is still partially powered, for example, 1.65 V.

FIGS. 14 to 16 describe a particular operation mode of enabling and disabling the power consumption saving function for the read operation, the write operation, and the erase operation when the interface operates in the first mode. In the first mode, when the power consumption saving function is enabled, the high-speed IO circuit is converted from an activated state (i.e., a normal operating state) to a standby state, and is powered by a standby voltage, and the bias circuit and the high-speed clock duty cycle correction circuit thereof may both be turned off to save power consumption.

Figure 17:
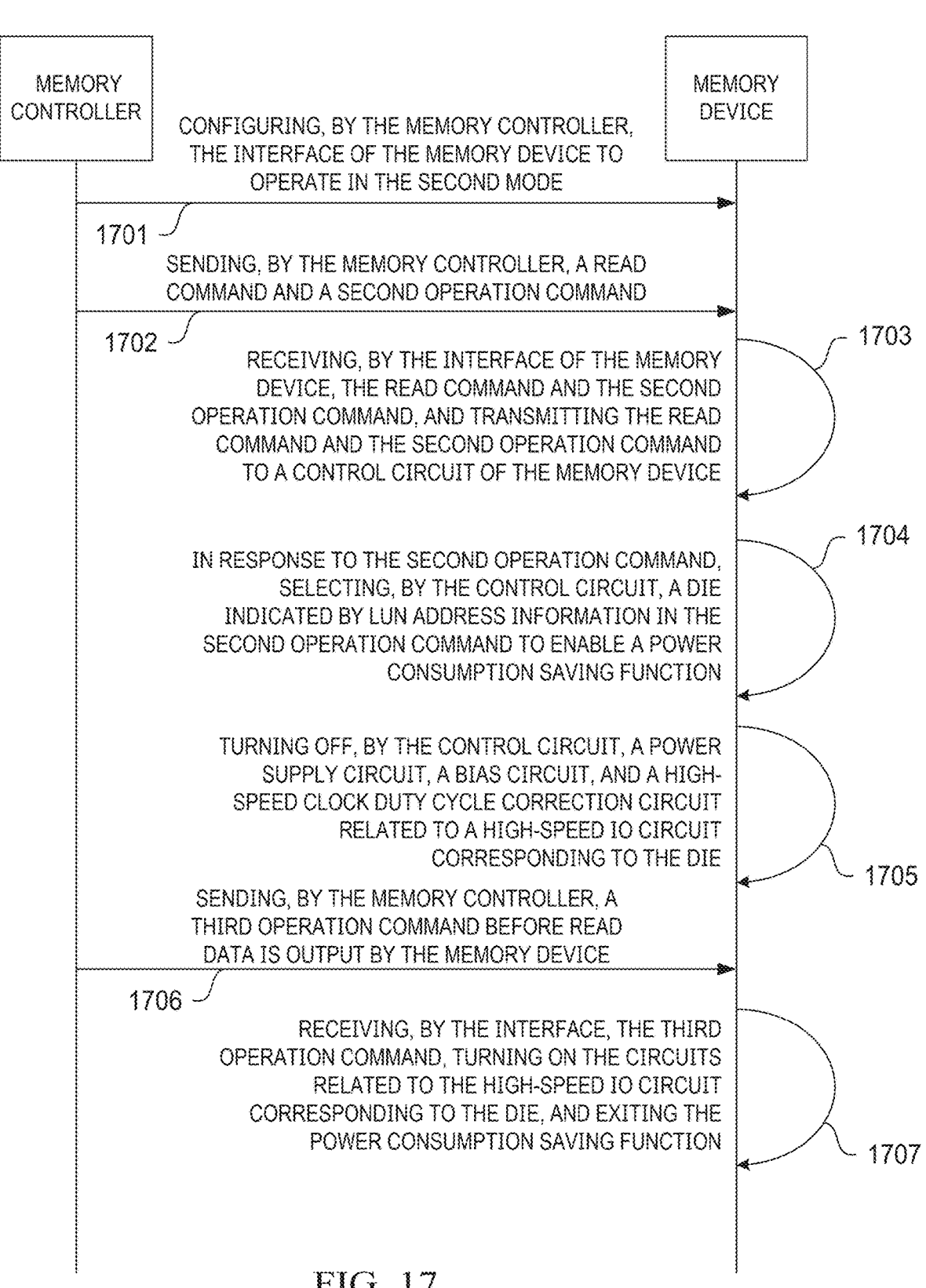
FIG. 17 is a flow diagram of realizing the enabling and disabling of a power consumption saving function through an interaction between a memory device and a memory controller when an interface of the memory device operates in a second mode and a first operation is a read operation provided by examples of the present application.

FIG. 17 shows a flow diagram IV in a memory system to realize operations of examples of the present application. In FIG. 17, the memory system includes a memory controller and a memory device, and an interface of the memory device operates in a second mode and a first operation is a read operation.

Based on this, the flow may include the following operations.

Operation 1701: configuring, by the memory controller, the interface of the memory device to work in the second mode.

The memory device configures, according to an SCA protocol, the interface of the memory device to work in the second mode. In an example, the memory controller may cause, through Set Feature Address: 02h, the interface of the memory device to enter a communication mode based on the SCA protocol. It is to be noted that, this operation may also be performed during a power-on process of the memory device. In other words, the memory device may configure the interface to work in the second mode at start-up.

Operation 1702: sending, by the memory controller, a read command and a second operation command.

In an example, the memory controller first sets a SCA header as a first identifier, sends read identifier information (second command identifier information, such as 00h) in the read command, then sets the SCA header as a second identifier, and sends corresponding read address information (second address information). Then, the SCA header becomes the first identifier, and first command identifier information (such as 03h) of the second operation command is sent; and then the SCA header becomes the second identifier, and first address information is sent, or the first address information and third address information are sent.

Operation 1703: receiving, by the interface of the memory device, the read command and the second operation command, and transmitting the read command and the second operation command to a control circuit of the memory device.

Operation 1704: in response to the second operation command, selecting, by the control circuit, a die indicated by LUN address information in the second operation command to enable a power consumption saving function.

Operation 1705: turning off, by the control circuit, a power supply circuit, a bias circuit, and a high-speed clock duty cycle correction circuit related to a high-speed IO circuit corresponding to the die, and the high-speed IO circuit.

Operation 1706: sending, by the memory controller, a third operation command before read data is output by the memory device.

Operation 1707: receiving, by the interface, the third operation command, turning on the circuits related to the high-speed IO circuit corresponding to the die, and exiting the power consumption saving function.

A sending mode of the third operation command is the same as the sending modes of the first operation command and the second operation command as mentioned above, and thus is not described herein again. Command identifier information of the third operation command may be 04h, and address information included therein may also be the first address information, or may be the first address information and the third address information. It is to be noted that, in the second mode, when the power consumption saving function is enabled, the high-speed IO circuit and the power supply circuit, the bias circuit, and the high-speed clock duty cycle correction circuit related to the high-speed IO circuit are all turned off. During a practical application process, the memory controller may also exit the communication mode based on the SCA protocol through a SCA reset command (such as 99h), i.e., cause the interface to exit the second mode. It is to be noted that, after the interface of the memory device exiting the second mode, it enters the first mode for operating.

Figure 18:
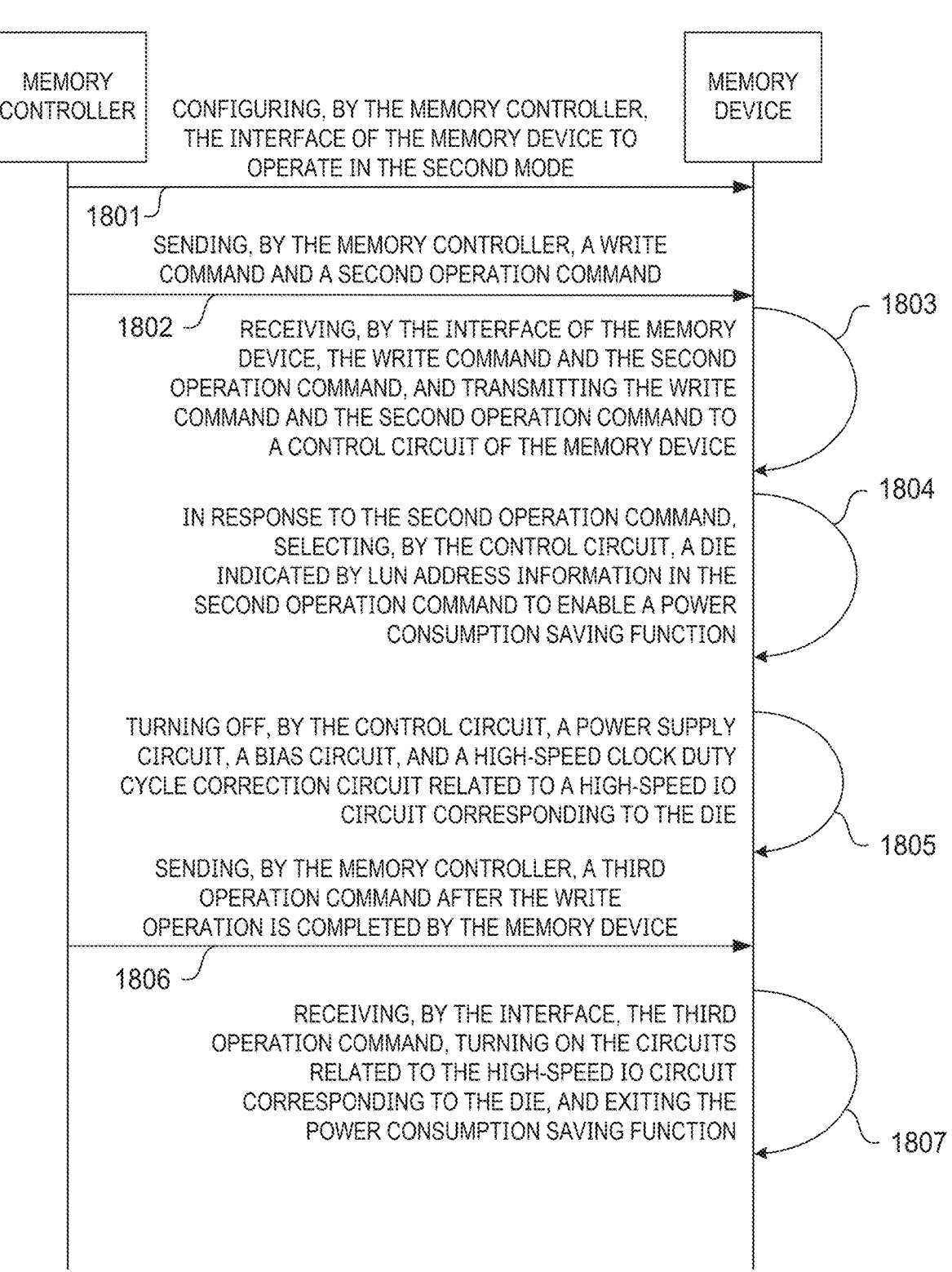
FIG. 18 is a flow diagram of realizing the enabling and disabling of a power consumption saving function through an interaction between a memory device and a memory controller when an interface of the memory device operates in a second mode and a first operation is a write operation provided by examples of the present application.

FIG. 18 shows a flow diagram V in a memory system to realize operations of examples of the present application. In FIG. 18, the memory system includes a memory controller and a memory device, and an interface of the memory device operates in a second mode and a first operation is a write operation.

Based on this, the flow may include the following operations.

Operation 1801: configuring, by the memory controller, the interface of the memory device to work in the second mode.

The memory device configures, according to an SCA protocol, the interface of the memory device to work in the second mode.

Operation 1802: sending, by the memory controller, a write command and a second operation command.

In an example, the memory controller first sets a SCA header as a first identifier, sends write identifier information (second command identifier information, such as 80h) in the write command, then sets the SCA header as a second identifier, and sends corresponding write address information (second address information). Then, the SCA header becomes the first identifier, and first command identifier information (such as 03h) of the second operation command is sent; and then the SCA header becomes the second identifier, and first address information is sent, or the first address information and third address information are sent.

Operation 1803: receiving, by the interface of the memory device, the write command and the second operation command, and transmitting the write command and the second operation command to a control circuit of the memory device.

Operation 1804: in response to the second operation command, selecting, by the control circuit, a die indicated by LUN address information in the second operation command to enable a power consumption saving function.

Operation 1805: turning off, by the control circuit, a power supply circuit, a bias circuit, and a high-speed clock duty cycle correction circuit related to a high-speed IO circuit corresponding to the die, and the high-speed IO circuit.

Operation 1806: sending, by the memory controller, a third operation command after the write operation is completed by the memory device.

Operation 1807: receiving, by the interface, the third operation command, turning on the circuits related to the high-speed IO circuit corresponding to the die, and exiting the power consumption saving function.

A sending mode of the third operation command is the same as the sending modes of the first operation command and the second operation command as mentioned above, and thus is not described herein again. Command identifier information of the third operation command may be 04h, and address information included therein may also be the first address information, or may be the first address information and the third address information. It is to be noted that, in the second mode, when the power consumption saving function is enabled, the high-speed IO circuit and the power supply circuit, the bias circuit, and the high-speed clock duty cycle correction circuit related to the high-speed IO circuit are all turned off.

Figure 19:
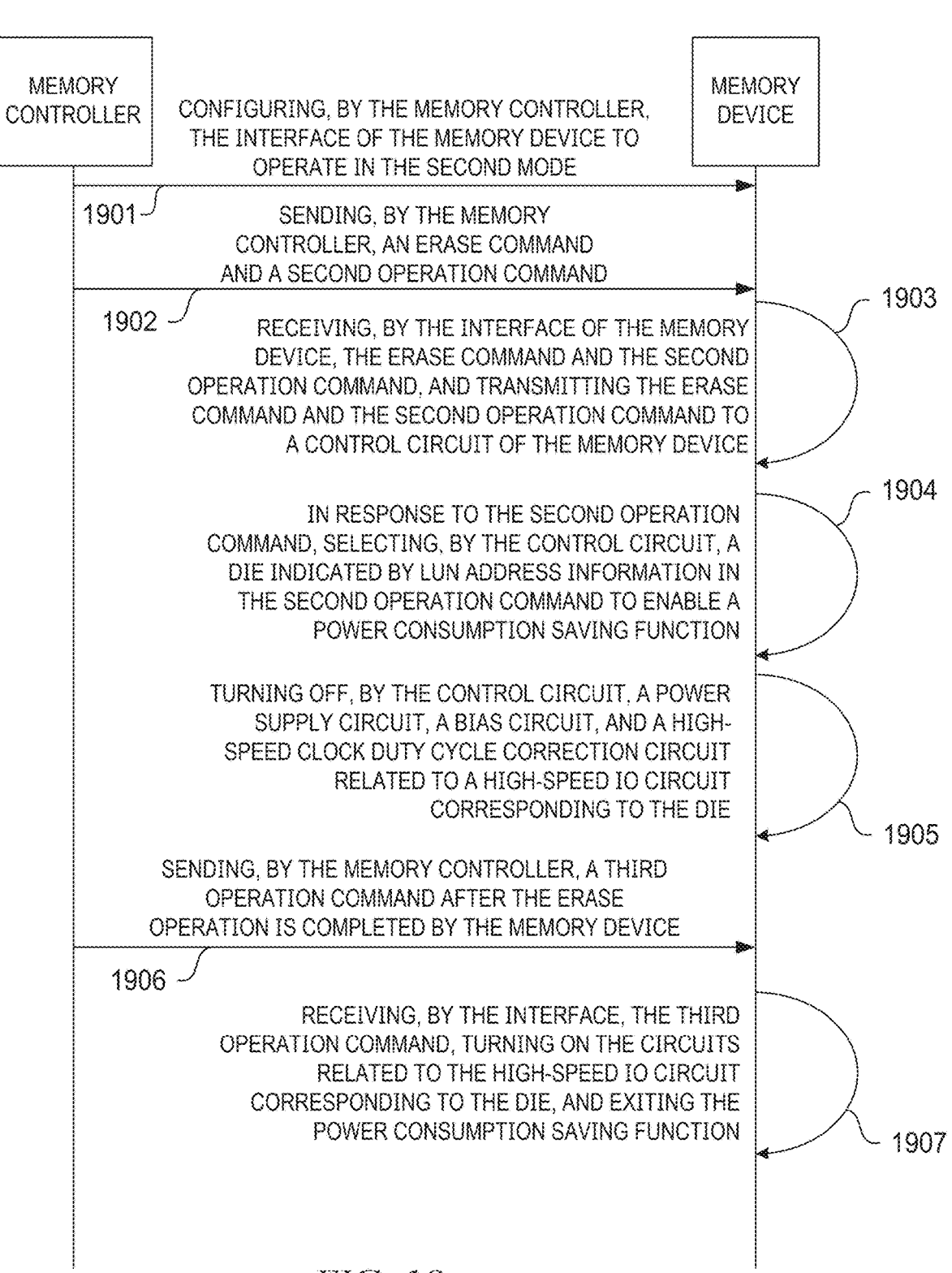
FIG. 19 is a flow diagram of realizing the enabling and disabling of a power consumption saving function through an interaction between a memory device and a memory controller when an interface of the memory device operates in a second mode and a first operation is an erase operation provided by examples of the present application.

FIG. 19 shows a flow diagram V in a memory system to realize operations of examples of the present application. In FIG. 19, the memory system includes a memory controller and a memory device, and an interface of the memory device operates in a second mode and a first operation is an erase operation.

Based on this, the flow may include the following operations.

Operation 1901: configuring, by the memory controller, the interface of the memory device to work in the second mode.

The memory device configures, according to an SCA protocol, the interface of the memory device to work in the second mode.

Operation 1902: sending, by the memory controller, an erase command and a second operation command.

In an example, the memory controller first sets a SCA header as a first identifier, sends erase identifier information (second command identifier information, such as 60h) in the erase command, then sets the SCA header as a second identifier, and sends corresponding erase address information (second address information). Then, the SCA header becomes the first identifier, and first command identifier information (such as 03h) of the second operation command is sent; and then the SCA header becomes the second identifier, and first address information is sent, or the first address information and third address information are sent.

Operation 1903: receiving, by the interface of the memory device, the erase command and the second operation command, and transmitting the erase command and the second operation command to a control circuit of the memory device.

Operation 1904: in response to the second operation command, selecting, by the control circuit, a die indicated by LUN address information in the second operation command to enable a power consumption saving function.

Operation 1905: turning off, by the control circuit, a power supply circuit, a bias circuit, and a high-speed clock duty cycle correction circuit related to a high-speed IO circuit corresponding to the die, and the high-speed IO circuit.

Operation 1906: sending, by the memory controller, a third operation command after the erase operation is completed by the memory device.

Operation 1907: receiving, by the interface, the third operation command, turning on the circuits related to the high-speed IO circuit corresponding to the die, and exiting the power consumption saving function.

A sending mode of the third operation command is the same as the sending modes of the first operation command and the second operation command as mentioned above, and thus is not described herein again. Command identifier information of the third operation command may be 04h, and address information included therein may also be the first address information, or may be the first address information and the third address information. It is to be noted that, in the second mode, when the power consumption saving function is enabled, the high-speed IO circuit and the power supply circuit, the bias circuit, and the high-speed clock duty cycle correction circuit related to the high-speed IO circuit are all turned off.

It is to be noted that, the flow shown in FIGS. 17 to 19 describe a particular operation mode of enabling and disabling the power consumption saving function for the read operation, the write operation, and the erase operation when the interface operates in the second mode. In the second mode, when the power consumption saving function is enabled, the high-speed IO circuit and the power supply circuit, bias circuit and high-speed clock duty cycle correction circuit thereof may all be turned off to save power consumption.

The above descriptions are only examples of the present application, and are not used to limit the protection scope of the present application.

What is claimed is:

1. An interface of a memory device, wherein the interface comprises a first circuit and is configured to:

receive a first operation command and a second operation command, wherein the first operation command is to indicate to perform a first operation on the memory device, the second operation command is to indicate to turn off the first circuit in the memory device, and the first circuit comprises a circuit that may not be used when the first operation is performed on the memory device; and receive a third operation command, wherein the third operation command is to indicate to turn on the first circuit.

2. The interface of claim 1, wherein the second operation command comprises:

first address information, wherein the first address information is to indicate a first die on which the first operation is performed in the memory device.

3. The interface of claim 2, wherein the first operation command comprises:

second address information, wherein the second address information is to indicate a page on which the first operation is performed in the first die, and the second address information comprises the first address information.

4. The interface of claim 3, further configured to:

work in a first mode, wherein in the first mode, the interface employs an Open NAND Flash Interface (ONFI) or Toggle standard protocol to receive the first operation command and the second operation command, and wherein in the ONFI or Toggle standard protocol, an address latch enable signal is employed to determine that the interface receives the second address information and the first address information, and a command latch enable signal is employed to determine that the interface receives second command identifier information included in the first operation command and first command identifier information included in the second operation command.

5. The interface of claim 4, wherein in the first mode, the first circuit that is turned off comprises at least one of the following:

a power supply circuit of a high-speed I/O circuit corresponding to the first die in the memory device;

a bias circuit of the high-speed I/O circuit corresponding to the first die in the memory device; or a high-speed clock duty cycle correction circuit of the high-speed I/O circuit corresponding to the first die in the memory device.

6. The interface of claim 3, further configured to:

work in a second mode, wherein in the second mode, the interface employs a separate command address SCA protocol to receive the first operation command and the second operation command, and wherein in the SCA protocol, a first identifier is employed to determine that the interface receives the second address information and the first address information, and a second identifier is employed to determine that the interface receives second command identifier information included in the first operation command and first command identifier information included in the second operation command, wherein the first identifier is different from the second identifier.

7. The interface of claim 6, wherein in the second mode, the first circuit that is turned off comprises at least one of the following:

a high-speed I/O circuit corresponding to the first die in the memory device;

a power supply circuit of the high-speed I/O circuit corresponding to the first die in the memory device;

a bias circuit of the high-speed I/O circuit corresponding to the first die in the memory device; or a high-speed clock duty cycle correction circuit of the high-speed I/O circuit corresponding to the first die in the memory device.

8. The interface of claim 2, wherein the second operation command further comprises:

third address information, wherein the third address information is to indicate a second die on which the first operation is not performed in the memory device.

9. A memory device, comprising:

an interface configured to receive a first operation command and a second operation command;

a memory array; and a control circuit connected with the interface and the memory array respectively and configured to:

perform a first operation on the memory array in response to the first operation command; and turn off a first circuit in the interface in response to the second operation command, wherein the first circuit comprises a circuit that may not be used when the first operation is performed on the memory device, the interface is further configured to receive a third operation command, and the control circuit is further configured to turn on the first circuit in response to the third operation command.

10. The memory device of claim 9, wherein the memory array comprises a plurality of dies, and each die comprises a plurality of pages, the second operation command comprises:

first address information, wherein the first address information is to indicate a first die on which the first operation is performed in the memory array, and the first operation command comprises:

second address information, wherein the second address information is to indicate a page on which the first operation is performed in the first die, and the second address information comprises the first address information.

11. The memory device of claim 10, wherein the interface is further configured to:

work in a first mode, wherein in the first mode, the interface employs an Open NAND Flash Interface (ONFI) or Toggle standard protocol to receive the first operation command and the second operation command, and wherein in the ONFI or Toggle standard protocol, an address latch enable signal is employed to determine that the interface receives the second address information and the first address information, and a command latch enable signal is employed to determine that the interface receives second command identifier information included in the first operation command and first command identifier information included in the second operation command.

12. The memory device of claim 11, wherein in the first mode, the first circuit that is turned off comprises at least one of the following:

a power supply circuit of a high-speed I/O circuit corresponding to the first die in the interface;

a bias circuit of the high-speed I/O circuit corresponding to the first die in the interface; or a high-speed clock duty cycle correction circuit of the high-speed I/O circuit corresponding to the first die in the interface.

13. The memory device of claim 10, wherein the interface is further configured to:

work in a second mode, wherein in the second mode, the interface employs a separate command address SCA protocol to receive the first operation command and the second operation command, and wherein in the SCA protocol, a first identifier is employed to determine that the interface receives the second address information and the first address information, and a second identifier is employed to determine that the interface receives second command identifier information included in the first operation command and first command identifier information included in the second operation command, wherein the first identifier is different from the second identifier.

14. The memory device of claim 13, wherein in the second mode, the first circuit that is turned off comprises at least one of the following:

a high-speed I/O circuit corresponding to the first die in the interface;

a power supply circuit of the high-speed I/O circuit corresponding to the first die in the interface;

a bias circuit of the high-speed I/O circuit corresponding to the first die in the interface; or a high-speed clock duty cycle correction circuit of the high-speed I/O circuit corresponding to the first die in the interface.

15. The memory device of claim 10, wherein the second operation command further comprises:

third address information, wherein the third address information is to indicate a second die on which the first operation is not performed in the memory array.

16. A method of operating a memory device, comprising:

receiving a first operation command and a second operation command;

performing a first operation on the memory device in response to the first operation command;

turning off a first circuit in the memory device in response to the second operation command;

receiving a third operation command; and turning on the first circuit in response to the third operation command, and wherein the first circuit comprises a circuit that may not be used when the first operation is performed on the memory device.

17. The method of claim 16, wherein the second operation command comprises:

first address information, wherein the first address information is to indicate a first die on which the first operation is performed in the memory device, and the first operation command comprises:

second address information, wherein the second address information is to indicate a page on which the first operation is performed in the first die, and the second address information comprises the first address information.

18. The method of claim 17, further comprising:

employing an Open NAND Flash Interface (ONFI) or Toggle standard protocol to receive the first operation command and the second operation command; or employing a separate command address SCA protocol to receive the first operation command and the second operation command.

19. The method of claim 18, wherein in the case of employing an ONFI or Toggle standard protocol to receive the first operation command and the second operation command, the first circuit that is turned off comprises at least one of the following:

a power supply circuit of a high-speed I/O circuit corresponding to the first die in the memory device;

a bias circuit of the high-speed I/O circuit corresponding to the first die in the memory device; or a high-speed clock duty cycle correction circuit of the high-speed I/O circuit corresponding to the first die in the memory device.

20. The method of claim 18, wherein in the case of employing a separate command address SCA protocol to receive the first operation command and the second operation command, the first circuit that is turned off comprises at least one of the following:

a high-speed I/O circuit corresponding to the first die in the memory device;

a power supply circuit of the high-speed I/O circuit corresponding to the first die in the memory device;

a bias circuit of the high-speed I/O circuit corresponding to the first die in the memory device; or a high-speed clock duty cycle correction circuit of the high-speed I/O circuit corresponding to the first die in the memory device.

* * * * *